(12) United States Patent
Kim et al.

(10) Patent No.: US 10,542,632 B2
(45) Date of Patent: Jan. 21, 2020

(54) PRINTED CIRCUIT BOARD AND ELECTRONIC DEVICE INCLUDING THE SAME

(71) Applicant: Samsung Electronics Co., Ltd., Suwon-si, Gyeonggi-do (KR)

(72) Inventors: Min Soo Kim, Gumi-si (KR); Ki Man Kim, Gumi-si (KR); Chul Hyung Yang, Gumi-si (KR); Ji Woo Lee, Gumi-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/401,707

(22) Filed: Jan. 9, 2017

(65) Prior Publication Data

US 2017/0290184 A1    Oct. 5, 2017

(30) Foreign Application Priority Data

Apr. 1, 2016    (KR) .................. 10-2016-0040313

(51) Int. Cl.
*H05K 1/14*        (2006.01)
*H05K 7/14*        (2006.01)
*H05K 1/11*        (2006.01)

(52) U.S. Cl.
CPC ............. *H05K 7/1427* (2013.01); *H05K 1/11* (2013.01); *H05K 1/14* (2013.01); *H05K 2201/04* (2013.01); *H05K 2201/10189* (2013.01)

(58) Field of Classification Search
CPC .................................. H05K 7/142

USPC .......................................... 361/752
See application file for complete search history.

(56) References Cited

U.S. PATENT DOCUMENTS

| | | | |
|---|---|---|---|
| 7,107,072 B1* | 9/2006 | Smith ................. | H04B 1/38 455/348 |
| 7,345,885 B2* | 3/2008 | Boudreaux ............ | H05K 1/144 165/185 |
| 8,934,261 B2 | 1/2015 | Lin et al. | |
| 9,468,093 B2 | 10/2016 | Peterson et al. | |
| 9,479,758 B2 | 10/2016 | Woo et al. | |
| 9,627,754 B2 | 4/2017 | Na | |
| 9,635,227 B2 | 4/2017 | Woo et al. | |
| 9,672,970 B2 | 6/2017 | Yosui et al. | |

(Continued)

FOREIGN PATENT DOCUMENTS

| | | |
|---|---|---|
| EP | 2 555 526 A2 | 2/2013 |
| KR | 10-1305518 B1 | 9/2013 |
| KR | 10-2014-0055516 A | 5/2014 |

*Primary Examiner* — Stanley Tso
(74) *Attorney, Agent, or Firm* — Jefferson IP Law, LLP

(57) ABSTRACT

An electronic device is provided. The electronic device includes a housing, a first printed circuit board seated inside the housing, and a second printed circuit board seated inside the housing such that a height of the second printed circuit board from the second surface is different from that of the first printed circuit board, wherein the first printed circuit board includes a mounting part on which at least one component is mounted, a first connector which extends from a first part of the mounting part. A portion of the first connector being substantially perpendicular to the mounting part and configured to be connected to the second printed circuit board, and a second connector which extends from a second part of the mounting part and configured to be connected to the second printed circuit board.

20 Claims, 16 Drawing Sheets

(56) References Cited

U.S. PATENT DOCUMENTS

| | | |
|---|---|---|
| 9,813,691 B2 | 11/2017 | Woo et al. |
| 2006/0103758 A1* | 5/2006 | Yoon ............... H04N 5/2253 |
| | | 348/374 |
| 2008/0130234 A1* | 6/2008 | Maehara ............ G06F 1/203 |
| | | 361/704 |
| 2010/0159755 A1 | 6/2010 | Lin et al. |
| 2012/0155041 A1 | 6/2012 | Lin et al. |
| 2013/0033581 A1 | 2/2013 | Woo et al. |
| 2013/0257712 A1* | 10/2013 | Imamura ............ H01Q 1/243 |
| | | 345/156 |
| 2014/0071022 A1 | 3/2014 | Na |
| 2014/0198454 A1* | 7/2014 | Yuan ................. H05K 7/209 |
| | | 361/720 |
| 2014/0198471 A1* | 7/2014 | Kajio ................ H05K 7/142 |
| | | 361/804 |
| 2015/0340151 A1 | 11/2015 | Yosui et al. |
| 2015/0351233 A1 | 12/2015 | Peterson et al. |
| 2016/0077303 A1* | 3/2016 | Ogino ................ F16F 1/021 |
| | | 359/824 |
| 2017/0013178 A1 | 1/2017 | Woo et al. |
| 2017/0093059 A1* | 3/2017 | Chen ................. H05K 1/0219 |
| 2017/0125156 A1 | 5/2017 | Yosui et al. |
| 2017/0188014 A1 | 6/2017 | Woo et al. |

* cited by examiner

PRINTED CIRCUIT BOARD AND ELECTRONIC DEVICE INCLUDING THE SAME

CROSS-REFERENCE TO RELATED APPLICATION(S)

This application claims the benefit under 35 U.S.C. § 119(a) of a Korean patent application filed on Apr. 1, 2016 in the Korean Intellectual Property Office and assigned Serial number 10-2016-0040313, the entire disclosure of which is hereby incorporated by reference.

TECHNICAL FIELD

The present disclosure relates to a printed circuit board and an electronic device including the same.

BACKGROUND

Electronic devices such as smartphones may include various electronic components for performing various functions. The electronic components may be mounted on a printed circuit board, and the printed circuit board may be arranged inside the electronic device.

The electronic device may include a plurality of printed circuit boards. The forms of the printed circuit boards and the types of the electronic components mounted on the printed circuit boards may be different according to the arrangement locations of the printed circuit boards. Further, the arrangement heights of the printed circuit boards from the rear surface of the electronic device may be different. In order to compensate for the steps, in an electronic device according to the related art, rigid printed circuit boards (PCBs) may be connected to each other by using flexible printed circuit boards, and signals may be transmitted and received between the rigid printed circuit boards through signal lines formed in the flexible printed circuit boards.

In relation to a printed circuit board, when a micro-strip line or strip line for transmitting and receiving a high-frequency signal (for example, a radio frequency (RF) signal) is implemented, a distance between a signal line and a ground area may act as a factor that determines the width of the signal line. For example, as the distance between the signal line and the ground area becomes larger, the width of the signal line may become larger. Further, even though signal lines have the same impedance, transmission loss becomes lower as the widths of the signal lines become larger. However, in relation to a flexible printed circuit board, an insulation layer (for example, a prepreg layer) applied between copper foil layers used as signal lines or the ground may be omitted and an air layer may be provided, it may be difficult to maintain the thickness of the air layer at the thickness of the insulation layer due to the characteristics of the flexible printed circuit board. For example, the thickness of the air layer may have a deviation according to the coupling state of the flexible printed circuit board. The deviation of the thickness of the air layer may cause an impedance deviation of the signal lines. Further, when a distance between a signal line and a ground area is smaller as the thickness of the air layer is small, the width of the signal line is smaller than the signal line of the flexible printed circuit board, making it impossible to increase transmission loss. As another example, if a high-frequency signal is transmitted and received through a signal line formed in a flexible printed circuit board, transmission loss may be generated by a coupling phenomenon of adjacent signal lines or signal quality may be lowered due to introduction of noise signals.

In order to solve this, an electronic device according to the related art may transmit and receive high-frequency signals by using a separate transmission line, for example, a coaxial cable.

The coaxial cable may require a dedicated connector (for example, a receptacle) and a mechanism for inserting or fixing a coaxial cable. This may increase material costs, and a mounting space for other electronic components may be restricted by an arrangement space of a mechanism.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a printed circuit board that includes a plurality of connectors connected to rigid printed circuit boards having different arrangement heights and having signal lines and that is arranged in a height wise direction of an electronic device such that at least one of the connectors are attached to a side wall of a mechanism provided inside the electronic device, and an electronic device including the same.

In accordance with an aspect of the present disclosure, an electronic device is provided. The electronic device includes a housing including a first surface that faces a first direction, a second surface that faces a second direction, and a side surface between the first surface and the second surface, a first printed circuit board seated inside the housing, and a second printed circuit board seated inside the housing such that a height of the second printed circuit board from the second surface is different from that of the first printed circuit board, wherein the first printed circuit board includes a mounting part on which at least one component is mounted, a first connector which extends from a first part of the mounting part; and a portion of the first connector being substantially perpendicular to the mounting part and configured to be connected to the second printed circuit board, and a second connector which extends from a second part of the mounting part and configured to be connected to the second printed circuit board.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
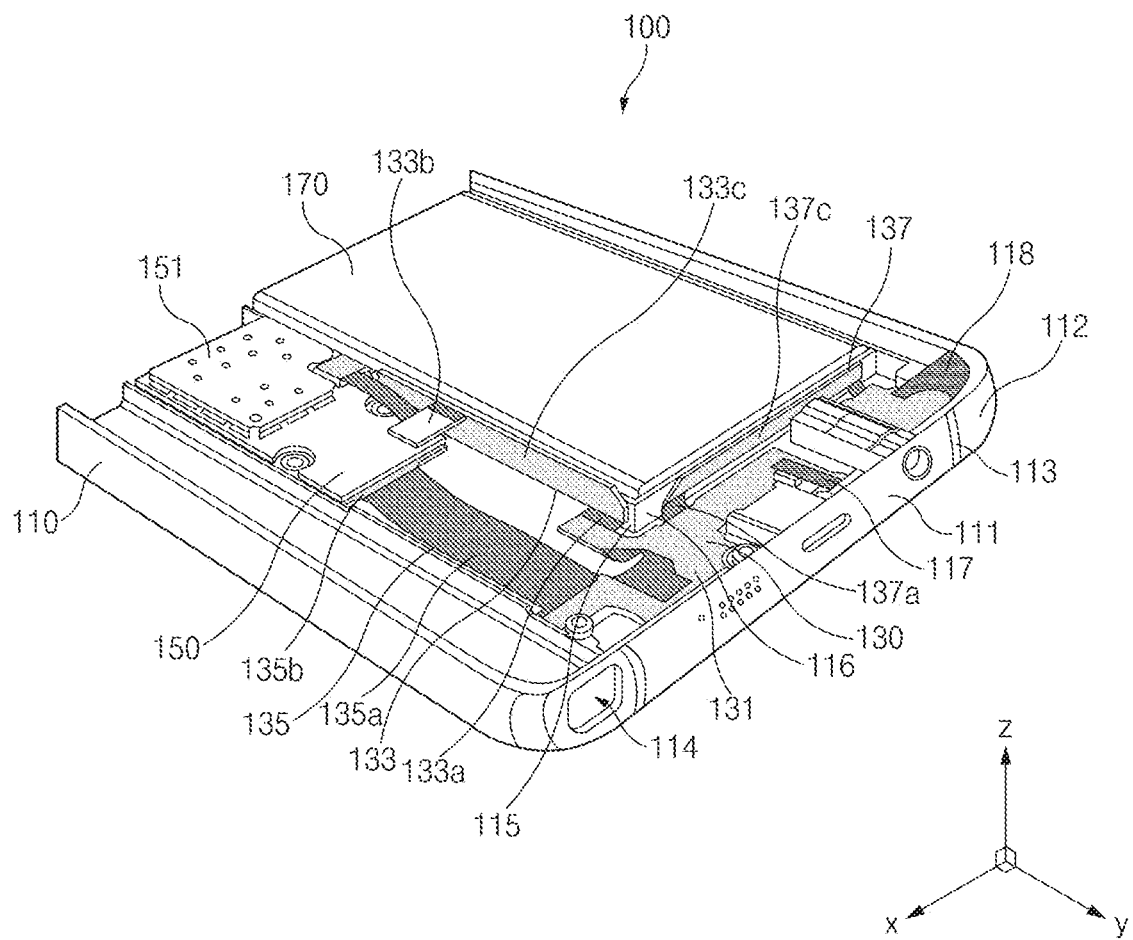
FIG. 1 is a perspective view of a part of an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expression "configured to" may be interchangeably used with, for example, "suitable for", "capable of", "modified to", "made to", "able to", or "designed to" according to a situation in a hardware or software way. In some situations, the expression "a device configured to" may mean that the device is "capable of" operating together with another device or other components. central processing unit (CPU), for example, a "processor configured to (or set to) perform A, B, and C" may mean a dedicated processor (for example, an embedded processor) for performing a corresponding operation or a generic-purpose processor (for example, a CPU or an application processor (AP) which may perform corresponding operations by executing one or more software programs which are stored in a memory device.

The electronic device according to various embodiments of the present disclosure, for example, may include at least one of a smartphone, a tablet personal computer (PC), a mobile phone, a video phone, an electronic book reader, a desktop PC, a laptop PC, a netbook computer, a workstation, a server, a personal digital assistant (PDA), a portable multimedia player (PMP), a Moving Picture Experts Group phase 1 or phase 2 (MPEG-1 or MPEG-2) audio layer 3 (MP3) player, a medical instrument, a camera, or a wearable device. The wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits). In some embodiments, the home appliances may include, for example, at least one of a digital versatile disc (DVD) player, an audio, a refrigerator, an air conditioner, a cleaner, an oven, a microwave oven, a washing machine, an air cleaner, a set-top box, a home automation control panel, a security control panel, a television (TV) box (for example, Samsung HomeSync™, Apple TV™, or Google TV™), a game console (for example, Xbox™ or PlayStation™), an electronic dictionary, an electronic key, a camcorder, or an electronic panel.

In an embodiment of the present disclosure, the electronic device may include at least one of various medical devices (for example, various portable medical measurement devices (a blood glucose meter, a heart rate measuring device, a blood pressure measuring device, and a body temperature measuring device), a magnetic resonance angiography (MRA), a magnetic resonance imaging (MRI) device, a computed tomography (CT) device, a photographing device, and an ultrasonic device), a navigation system, a global navigation satellite system (GNSS), an event data recorder (EDR), a flight data recorder (FDR), a vehicular infotainment device, electronic devices for vessels (for example, a navigation device for vessels and a gyro compass), avionics, a security device, a vehicular head unit, an industrial or home robot, an automatic teller's machine (ATM) of a financial company, a point of sales (POS) of a store, or an internet of things (for example, a bulb, various sensors, an electricity or gas meter, a spring cooler device, a fire alarm device, a thermostat, an electric pole, a toaster, a sporting apparatus, a hot water tank, a heater, and a boiler). According to various embodiments of the present disclosure, the electronic device may include at least one of a furniture or a part of a building/structure or a vehicle, an electronic board, an electronic signature receiving device, a projector, or various measurement devices (for example, a water service, electricity, gas, or electric wave measuring device). In various embodiments of the present disclosure, the electronic device may be flexible or the electronic device may be two or more combinations of the various devices. The electronic device according to the embodiment of the present disclosure is not limited to the aforementioned devices.

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1 is a perspective view of a part of an electronic device according to an embodiment of the present disclosure.

Referring to FIG. 1, the electronic device 100 may include a housing 110, a first printed circuit board 130, a second printed circuit board 150, and a battery 170. The housing 110 may fix and support internal elements (for example, a display, a bracket, and a printed circuit board) of the electronic device 100. The housing 110 may include a front surface, a rear surface, and a side surface that partially surrounds a space between the front surface and the rear surface. FIG. 1 illustrates that a first printed circuit board 130 and a second printed circuit board 150 are seated and fixed inside the housing 110. According to an embodiment, the housing 110 has side walls (for example, a first side wall 115 and a second side wall 116) in an inner area thereof to provide a space in which the battery 170 that supplies electric power to the internal elements may be seated.

According to various embodiments, at least one surface of the housing 110 may be formed of a metallic material. As an embodiment, a side surface of the housing 110 may include a metal frame. At least a portion of the metal frame and/or a conductive member provided inside the housing 110 may be utilized as an antenna. As illustrated in FIG. 1, a first part 111 of the metal frame that forms a portion of a widthwise (or the x-axis direction) side surface of the housing 110 and a first conductive member 117 extending from the first part 111 to the inside of the housing 110 may function as a first antenna, and a second part 112 of the metal frame that forms a portion of the widthwise side surface of the housing 110 and a portion of a lengthwise (or the y-axis direction) side surface of the housing 110 and a second conductive member 118 that extends from the second part 112 to the inside of the housing 110 may function as a second antenna. As another example, a slit 113 may be formed between the first part 111 of the metal frame utilized as the first antenna and the second part 112 of the metal frame utilized as the second antenna to space the first part 111 and the second part 112 apart from each other.

According to an embodiment, the housing 110 may have at least one through-hole 114 on the side surface thereof. A through-hole 114 is provided such that an external device (for example, a stylus pen, an electronic pen, a universal serial bus (USB) cable, or an earphone) may be inserted therethrough, and an interface module (for example, a USB connector or an earphone receptacle) seated in the inside of the housing 110 may be exposed to the outside through at least one through-hole 114.

Various electronic components may be mounted on the first printed circuit board 130 and the second printed circuit board 150. For example, a processor, a memory, a communication module (for example, a radio frequency (RF) module), an input/output interface module (or a USB module) or a functional module (for example, a power management module) may be mounted on the first printed circuit board 130 and/or the second printed circuit board 150. As another example, at least one electronic component mounted on the first printed circuit board 130 and/or the second printed circuit board 150 may be covered by a shield can 151 that may shield electromagnetic waves.

The first printed circuit board 130 and the second printed circuit board 150 may be electrically connected to each other. According to an embodiment, the first printed circuit board 130 and the second printed circuit board 150 may be electrically connected to each other through at least one connector provided in the first printed circuit board 130.

Referring to FIG. 1, the first printed circuit board 130 may include a mounting part 131, on which an electronic component is mounted, and a plurality of connectors that extends from a portion of the mounting part 131 and that is connected to another portion of the mounting part 131 or the second printed circuit board 150. FIG. 1 illustrates that the first printed circuit board 130 includes a first connector 133, a second connector 135, and a third connector 137. However, the present disclosure is not limited thereto. According to various embodiments, at least one of the connectors may be omitted, and at least another connector may be included in the first printed circuit board 130.

The connectors may include at least one bending part and at least one connection part. However, the present disclosure is not limited thereto. A connection part may be omitted from a connector (for example, the third connector 137) of the connectors, which extends from a portion of the mounting part 131 and is connected to another portion of the mounting part 131. Referring to FIG. 1, the first connector 133 includes a first bending part 133a and a first connection part 133b, the second connector 135 includes a second bending part 135a and a second connection part 135b, and the third connector 137 includes a third bending part 137a. At least one of the bending parts may be provided to compensate for a step between the first printed circuit board 130 and the second printed circuit board 150. As an embodiment, an area of the second bending part 135a may be bent towards the second printed circuit board 150. As another example, the first bending part 133a may be bent in a height wise direction (or the z-axis direction) of the housing 110 to be connected to a portion (for example, a first length extension part 133c) of the first connector 133 spaced apart from a rear surface of the housing 110 by a height that is the same as or similar to the size of the step between the first printed circuit board 130 and the second printed circuit board 150. The connectors may be connected to the first printed circuit board 130 and the second printed circuit board 150. According to an embodiment, the connectors may include connection components such as a receptacle, a B-to-B connector, or a contact terminal (for example, a C-clip). As another example, at least one of the connectors may include a length extension part. FIG. 1 illustrates that the first connector 133 includes a first length extension part 133c, and the third connector 137 includes a second length extension part 137c. The length extension part may extend from the bending part towards another portion of the mounting part 131 or the second printed circuit board 150. As an example, the first length extension part 133c may extend from the first bending part 133a towards the second printed circuit board 150, by a specific length, and the second length extension part 137c may extend from the third bending part 137a towards another portion of the mounting part 131, by a specific length.

The connectors may include a flexible printed circuit board and/or a rigid printed circuit board. FIG. 1 illustrates that the being parts correspond to flexible circuit boards and the connectors and the length extension parts correspond to rigid printed circuit boards. For example, the bending parts may correspond to a flexible printed circuit board formed of a flexible material to be bent towards the second printed circuit board 150 or the height wise direction of the housing 110.

At least one of the connectors may be arranged in the height wise direction of the housing 110. As an embodiment, the length extension parts may be arranged in the height direction of the housing 110, and at least one of the bending parts may connect the length extension parts and the mounting part 131. FIG. 1 illustrates that the first length extension part 133c and the second length extension part 137c are arranged in the height wise direction of the housing 110, and the first bending part 133a and the third bending part 137a connect the first length extension part 133c and the mounting part 131, and the second length extension part 137c and the mounting part 131, respectively. Because the length extension parts are arranged in the height wise direction (for example, a direction perpendicular to the rear surface of the housing 110), an interior space of the housing 110 may be partially secured so that a mounting space for electronic devices and an arrangement space for mechanisms may be secured.

Signal lines for transmitting and receiving signals between the first printed circuit board 130 and the second printed circuit board 150 may be provided in the connectors. According to the embodiments, the connectors may transmit and receive signals of different characteristics. Signal lines for transmitting and receiving high-frequency signals, for example, RF signals may be provided in the first connector 133 and the third connector 137 including the length extension parts, and signal lines for transmitting and receiving digital signals, for example, audio signals, interface signals (for example, USB signals), sensor signals, key input signals, or power signals may be provided in the second connector 135. However, the present disclosure is not limited thereto. In some embodiments, high-speed interface signals (for example, USB 3.0 signals) or power signals may be transmitted and received through the first connector 133 and/or the third connector 137. Because signals of different characteristics are separately transmitted through the physically spaced connectors, a phenomenon in which signal quality is lowered by noise signal interference or decoupling may be prevented. Because main signals, for example, high-speed interface signals or power signals, including high-frequency signals may be transmitted through the length extension part corresponding to a rigid printed circuit board, deviation of impedances and transmission loss may be prevented.

Figure 2A:
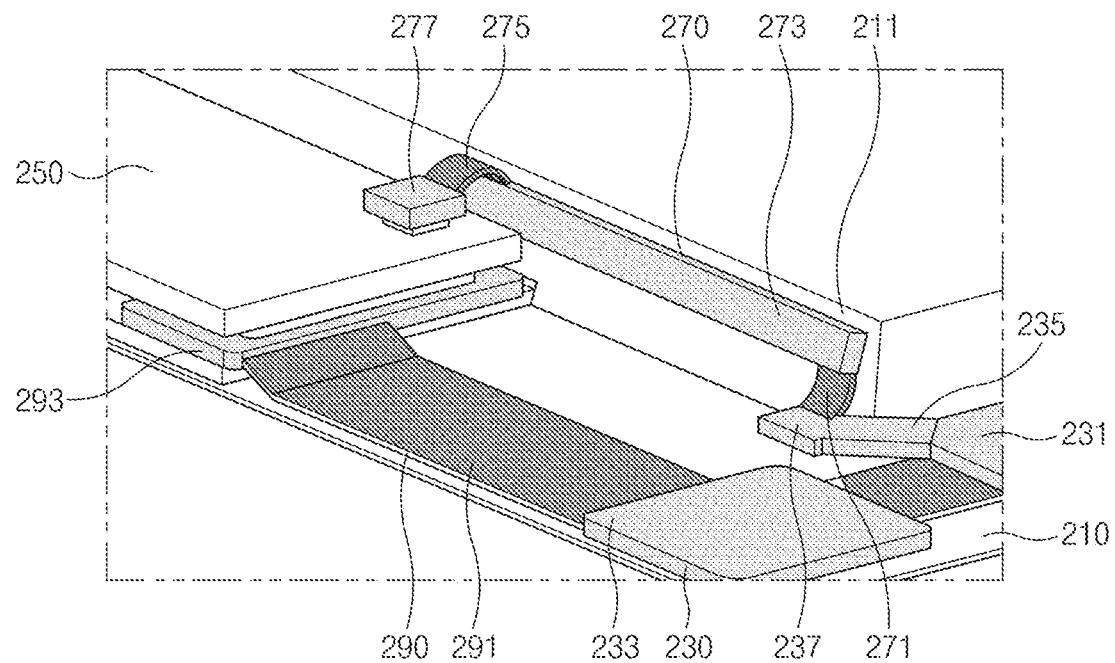
FIG. 2A is a view illustrating a connection form of a plurality of printed circuit boards according to an embodiment of the present disclosure.

FIG. 2A is a view illustrating a connection form of a plurality of printed circuit boards according to an embodiment of the present disclosure.

Figure 2B:
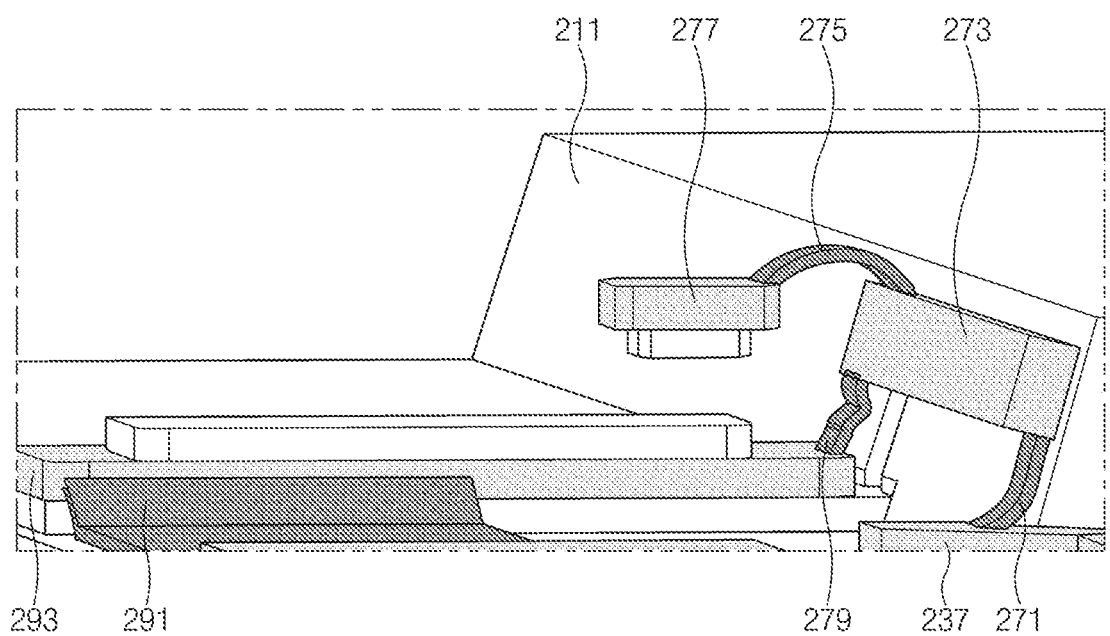
FIG. 2B is an enlarged view of a part of the printed circuit board of FIG. 2A according to an embodiment of the present disclosure.

FIG. 2B is an enlarged view of a part of a printed circuit board of FIG. 2A according to an embodiment of the present disclosure.

Figure 2C:
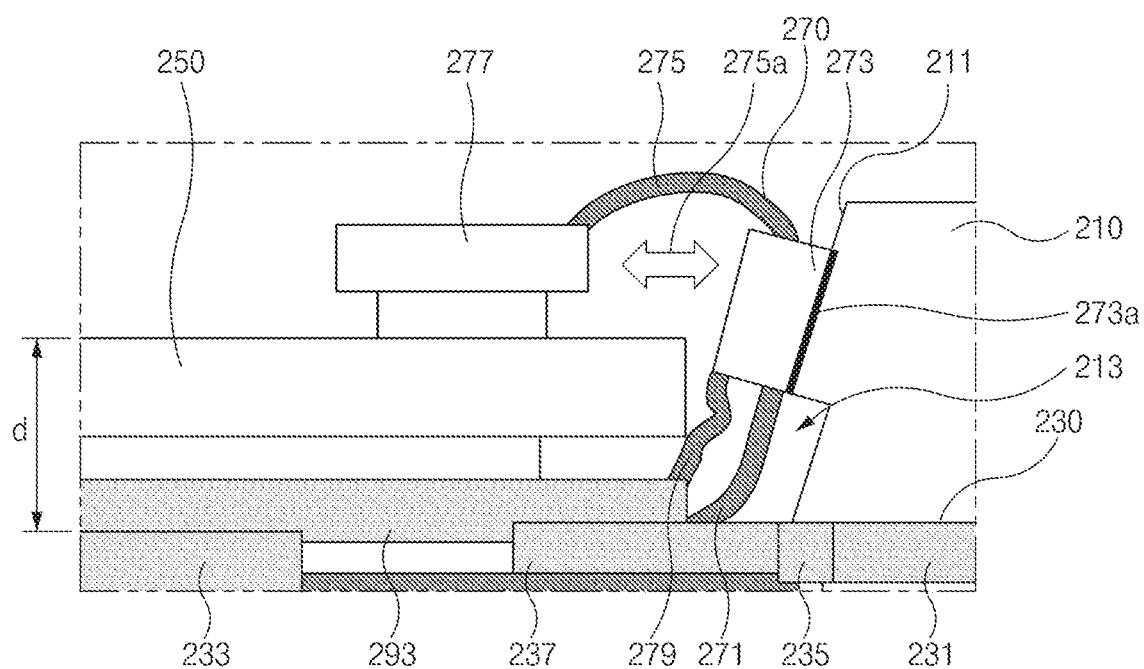
FIG. 2C is a side view of a part of the plurality of printed circuit boards of FIG. 2A according to an embodiment of the present disclosure.

FIG. 2C is a side view of a part of the plurality of printed circuit boards of FIG. 2A according to an embodiment of the present disclosure.

Referring to FIGS. 2A, 2B and 2C, an electronic device (for example, the electronic device 100) may include a plurality of printed circuit boards. The forms and types of the mounted electronic components may be different according to the arrangement locations of the plurality of printed circuit boards, and the arrangement heights of the electronic components from the rear surface of the electronic device may be different due to the arrangement structure. FIGS. 2A and 2C illustrate that the first printed circuit board 230 and the second printed circuit board 250 are formed and arranged in the housing 210 of the electronic device to have a step of a specific size (e.g., distance "d" in FIG. 2C).

The first printed circuit board 230 may include a mounting part and a plurality of connectors. The mounting part may be separated into a plurality of parts. FIGS. 2A and 2C illustrate that the mounting part is separated into a first mounting part 231 and a second mounting part 233, which are connected to each other through a flexible printed circuit board. The connectors extend from the mounting part, and may connect a portion and another portion of the mounting part or connect the mounting part and the second printed circuit board 250. FIGS. 2A and 2C illustrate that the first connector 270 extends from the first mounting part 231 to connect the first mounting part 231 and the second printed circuit board 250, and the second connector 290 extends from the second mounting part 233 to connect the second mounting part 233 and the second printed circuit board 250.

The connectors may include at least one bending part and at least one connection part, and at least one of the connectors may further include a length extension part. As an embodiment, the first connector 270 may include a first bending part 271, a first length extension part 273, a second bending part 275, a first connection part 277, and a third bending part 279. As another example, the second connector 290 may include a fourth bending part 291 and a second connection part 293. According to an embodiment, the first bending part 271, the second bending part 275, the third bending part 279, and the fourth bending part 291 correspond to flexible printed circuit board, and the first length extension part 273, the first connection part 277, and the second connection part 293 correspond to a rigid printed circuit board.

At least one of the bending parts may be provided to compensate for a step between the first printed circuit board 230 and the second printed circuit board 250. As an embodiment, the fourth bending part 291 may be extended from the second mounting part 233 and an area of the fourth bending part 291 may be bent towards the second printed circuit board 250. As another example, the first bending part 271 may extend from the first mounting part 231, and an area of the first bending part 271 may be bent in the height wise direction of the housing 210 to be connected to the first length extension part 273 that is spaced apart from the rear surface of the housing 210. The second bending part 275 may extend from the first length extension part 273, and an area of the second bending part 275 may be bent towards the first connection part 277 to be connected to the first connection part 277 that is arranged parallel to the second printed circuit board 250. The third bending part 279 may extend from the first length extension part 273, and an area of the third bending part 279 may be bent towards the second connection part 293 to be connected to the second connection part 293 that is arranged parallel to the second printed circuit board 250.

According to an embodiment, the lengths and bending forms of the bending parts may be different according to the spacing distances and arrangement forms of the mounting parts connected to opposite ends of the bending parts, the length extension parts, and the connectors. As an example, the length of the first bending part 271 may correspond to a spacing distance between the first mounting part 231 and the first length extension part 273, and an area of the first bending part 271 may be bent in a height wise direction of the housing 210 to connect the first mounting part 231 arranged substantially parallel to the rear surface of the housing 210 and the first length extension part 273 arranged substantially perpendicular to the rear surface of the housing 210. As another example, the length of the third bending part 279 may correspond to a spacing distance between the first length extension part 273 and the second connection part 293, and an area of the third bending part 279 may be bent in a height wise direction of the housing 210 to connect the second connection part 293 arranged substantially parallel to the rear surface of the housing 210 and the first length extension part 273 arranged substantially perpendicular to the rear surface of the housing 210.

The connection parts may be connected to at least one of the aforementioned bending parts. FIGS. 2A, 2B and 2C illustrate that the first connection part 277 is connected to the second bending part 275 and the second connection part 293 is connected to the third bending part 279 and the fourth bending part 291. The connection parts may include connection components, and the first printed circuit board 230 and the second printed circuit board 250 may be electrically connected to each other through the connection components. As another example, the connection parts provided at ends of the connectors may be connected to opposite surfaces of the second printed circuit board 250. For example, the first connection part 277 may be connected to the front surface of the second printed circuit board 250, and the second connection part 293 may be connected to the rear surface of the second printed circuit board 250.

The length extension part may be spaced apart from the rear surface of the housing 210 by a specific distance. As another example, the length extension part may be arranged in the height wise direction (for example, a direction perpendicular to the rear surface of the housing 210) of the housing 210. As another example, the length extension part may be attached to the side wall 211 of a structure (for example, a battery frame) provided inside the housing 210 or to an inner surface of the housing 210. The FIGS. 2A, 2B and 2C illustrate that the first length extension part 273 is spaced apart from the rear surface of the housing 210 by a specific distance and is attached to the side wall 211 of the structure provided inside the housing 210 in the height wise direction of the housing 210.

According to an embodiment, at least one bending part connected to the length extension part may be longer than a spacing distance between the length extension part and the connection part connected to the at least one bending part such that the length extension part is attached to the side wall 211 of the structure provided inside the housing 210. As an example, the second bending part 275 may be longer than a spacing distance between the first length extension part 273 and the first connection part 277. In this case, an area of the second bending part 275 may be bent to protrude upwards or downwards in the height wise direction of the housing 210 between the first length extension part 273 and the first connection part 277. Accordingly, a restoring force 275a, by which the second bending part 275 is apt to be spread out to an original state, is generated in an area of the bent second bending part 275, and the restoring force 275a allows the second bending part 275 to push the first length extension part 273 towards the side wall 211 such that the first length extension part 273 to be attached to the side wall 211. In some embodiments, the length extension part may be fixed to an area 273a in contact with an inner surface of the housing 210 or the side wall 211 of the structure provided inside the housing 210 by applying a bonding material or through a bonding member (for example, a bonding tape).

According to an embodiment, when the length extension part is arranged to be attached to the inner surface of the housing 210 or the side wall 211 of the structure provided inside the housing 210 and the bending part connected to the length extension part is bent towards the length extension part, the inner surface of the housing 210 or the side wall 211 of the structure may include a recess 213. The recess 213 is an area depressed to have a length, a width, and a depth, and may be provided such that the bending part does not contact the inner surface of the housing 210 or the side wall 211 of the structure.

According to an embodiment, with reference to FIG. 2C, the area 273a in which the length extension part contacts the inner surface of the housing 210 or the side wall 211 of the structure provided inside the housing 210 includes a conductive member (for example, a metal), and when a non-conductive bonding material or a bonding member is not present in the contact area 273a, the conductive member included in the contact area 273a and an area adjacent to the contact area 273a may be utilized as a ground area. In this case, the length extension part may exclude a cover layer and the ground layer may be exposed to the outside to contact the conductive member. Accordingly, because the ground area is expanded, the electrical characteristics of the signal lines formed in the length extension part may be improved.

According to an embodiment, when the length extension part is attached to a side wall of the side walls of a mechanism provided inside the housing 210, which does not face a side surface of the mounting part, the mounting part may include a first extension part 235 and a second extension part 237 that function as bridges. The first extension part 235 may extend from a peripheral portion of the mounting part, and may extend by a specific length adjacent to corners of the mounting part, to which the side walls are connected. The second extension part 237 may extend from the first extension part 235, and may extend by a specific length in parallel to the side wall, to which the length extension part is attached. FIGS. 2A and 2C illustrate that the mounting part 231 includes a first extension part 235 that extends from a peripheral portion of the first mounting part 231, and a second extension part 237 that extends from the first extension part 235 by a specific length in parallel to the side wall 211, to which the first length extension part 273 is attached. Distance "d" between an upper surface of the second mounting part 233 and an upper surface of the second printed circuit board 250 is illustrated in FIG. 2C.

Figure 3:
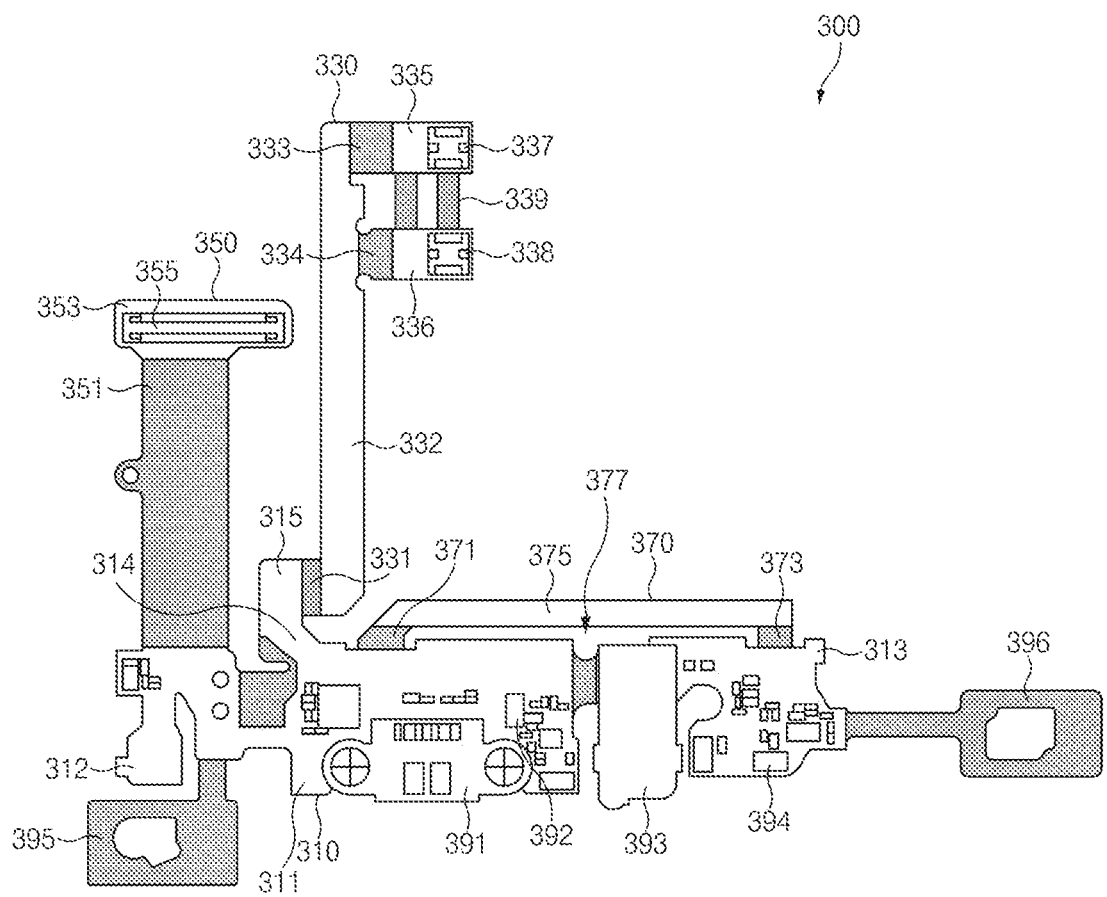
FIG. 3 is a plan view of a printed circuit board including a plurality of connectors according to an embodiment of the present disclosure.

FIG. 3 is a plan view of a printed circuit board including a plurality of connectors according to an embodiment of the present disclosure.

Referring to FIG. 3, a printed circuit board 300 (for example, the first printed circuit board 130 and 230) may include a mounting part 310, a first connector 330, a second connector 350, and a third connector 370. According to various embodiments, at least one of the aforementioned connectors may be omitted or at least another connector may be further included.

Various electronic components and/or mechanical components may be mounted on the mounting part 310. According to an embodiment, the mounting part 310 may be separated into a plurality of parts. FIG. 3 illustrates that the mounting part 310 is separated into a first mounting part 311, a second mounting part 312, and a third mounting part 313. The first mounting part 311 is situated in a central area of the mounting part 310, and a first interface module 391 (for example, a USB connector) and a first antenna connection terminal 392 may be mounted on the first mounting part 311. The second mounting part 312 is situated in a left area of the mounting part 310, and a first key module 395 may be mounted on the second mounting part 312. The third mounting part 313 is situated in a right area of the mounting part 310, and a second interface module 393 (for example, an earphone receptacle), a second antenna connection terminal 394, and a second key module 396 may be mounted on the third mounting part 313.

According to an embodiment, the first mounting part 311 may include a first extension part 314 that extends from a peripheral portion thereof by a specific length, and a second extension part 315 that extends from the first extension part 314 substantially in parallel to the first length extension part 332 by a specific length. FIG. 3 illustrates that the first extension part 314 extends from a periphery of a left upper end of the first mounting part 311 towards a left upper end of the printed circuit board 300 by a specific length, and the second extension part 315 extends from the first extension part 314 towards an upper end of the printed circuit board 300 by a specific length.

The first connector 330 may include a first bending part 331, a first length extension part 332, a second bending part 333, a third bending part 334, a first connection part 335, and a second connection part 336. The first bending part 331 may connect the second extension part 315 of the first mounting part 311 and the first length extension part 332. As an embodiment, the first bending part 331 corresponds to a flexible printed circuit board, and when the first length extension part 332 is arranged to be perpendicular to the rear surface of the housing (for example, the housing 110 and 210), it may be bent in a height wise direction (for example, a direction perpendicular to the rear surface of the housing) of the housing. However, the present disclosure is not limited thereto. Any form in which the first length extension part 332 is arranged to be substantially perpendicular to one surface of the housing in which the first mounting part 311 is arranged may pertain to the scope of the present disclosure.

The first length extension part 332 may extend from the first bending part 331 towards an upper end of the printed circuit board 300 by a specific length. As an embodiment, the first length extension part 332 may correspond to a rigid printed circuit board, and may be arranged to be perpendicular to the rear surface of the housing. As another example, the first length extension part 332 may be arranged to be attached to an inner surface of the housing, or a side wall of a structure provided inside the housing.

The second bending part 333 may extend from a lengthwise opposite side of the first length extension part 332, to which the first bending part 331 is connected, by a specific length and may be connected to the first connection part 335. As an embodiment, the second bending part 333 corresponds to a flexible printed circuit board, and if the first connection part 335 is arranged in parallel to another printed circuit board (for example, the second printed circuit board 150 and 250) to be connected to the second printed circuit board, it may be bent towards the first connection part 335. As another example, the second bending part 333 may be longer than a spacing distance between the first connection part 335 and the first length extension part 332. In this case, the second bending part 333 may be bent to protrude upwards or downwards in the height wise direction of the housing between the first connection part 335 and the first length extension part 332.

The third bending part 334 may extend from the first length extension part 332 by a specific length, and may be connected to the second connection part 336. The third bending part 334 may be situated between the first bending part 331 and the second bending part 333. As an embodiment, the third bending part 334 corresponds to a flexible printed circuit board, and if the second connection part 336 is arranged in parallel to another printed circuit board to be connected to the second printed circuit board, it may be bent towards the second connection part 336. Although FIG. 3 illustrates that the second bending part 333 and the third bending part 334 extend from the same side surface of the first length extension part 332, the present disclosure is not limited thereto. In some embodiments, the second bending part 333 and the third bending part 334 may extend from different side surfaces of the first length extension part 332.

The first connection part 335 may extend from the second bending part 333. According to an embodiment, the first connection part 335 may correspond to a rigid printed circuit board. The first connection part 335 may be provided such that the printed circuit board 300 is connected to another printed circuit board. According to an embodiment, the first connection part 335 may include a first connection component 337 (for example, a receptacle, a B-To-B connector, or a contact terminal).

The second connection part 336 may extend from the third bending part 334. According to an embodiment, the second connection part 336 may correspond to a rigid printed circuit board. The second connection part 336 may be provided such that the printed circuit board 300 is connected to another printed circuit board. According to an embodiment, the second connection part 336 may include a second connection component 338.

According to various embodiments, the first connection part 335 and the second connection part 336 may be connected to each other through at least one support 339. The support 339 may be provided to compensate for an assembly tolerance between the first connection component 337 and the second connection component 338 when the first connection component 337 and the second connection component 338 are assembled in the first connection part 335 and the second connection part 336 through a surface mounting technology, respectively. For example, the support 339 may correspond to a flexible printed circuit board, and may be bent towards the first connection part 335 or the second connection part 336 in an area between the first connection part 335 and the second connection part 336. As another example, the first connection part 335 and the second connection part 336 may be integrally provided. In this case, the support 339 may be omitted, the second bending part 333 and the third bending part 334 may be integrally provided, and the first connection component 337 and the second connection component 338 may be integrally provided.

The second connector 350 may include a fourth bending part 351 and a third connection part 353. The fourth bending part 351 may extend from the second mounting part 312, and may be connected to the third connection part 353. As an embodiment, the fourth bending part 351 may correspond to a flexible printed circuit board, and if the third connection part 353 is connected to another printed circuit board having a step, it may be bent towards the third connection part 353.

The third connection part 353 may extend from the fourth bending part 351. According to an embodiment, the third connection part 353 may correspond to a rigid printed circuit board. The third connection part 353 may be provided such that the printed circuit board 300 is connected to another printed circuit board. According to an embodiment, the third connection part 353 may include a third connection component 355.

The third connector 370 may include a fifth bending part 371, a sixth bending part 373, and a second length extension part 375. The fifth bending part 371 may extend from the first mounting part 311, and may be connected to the second length extension part 375. The sixth bending part 373 may extend from the third mounting part 313, and may be connected to the second length extension part 375. As an embodiment, the fifth bending part 371 and the sixth bending part 373 may correspond to a flexible printed circuit board, and when the second length extension part 375 is arranged to be perpendicular to the rear surface of the housing, it may be bent in the height wise direction of the housing.

The second length extension part 375 may be connected to the fifth bending part 371 and the sixth bending part 373, and may extend in parallel to a direction which the first mounting part 311 and the third mounting part 313 face by a specific length. FIG. 3 illustrates that the second length extension part 375 extends in the left and right directions of the printed circuit board 300. As an embodiment, the second length extension part 375 may correspond to a rigid printed circuit board, and may be arranged to be perpendicular to the rear surface of the housing. Further, a slot 377 may be formed between the first mounting part 311, the fifth bending part 371, the sixth bending part 373, and the second length extension part 375. The slot 377 may physically separate a signal line formed in the first mounting part 311 and a signal line formed in the second length extension part 375 to prevent interferences between signals. As another example, the second length extension part 375 may be arranged to be attached to an inner surface of the housing, or a side wall of a structure provided inside the housing. According to various embodiments, the second length extension part 375 may be connected to the first length extension part 332. For example, in the drawing, a left periphery of the second length extension part 375, to which the fifth bending part 371 is connected, and a right periphery of the first length extension part 332, to which the first bending part 331 is connected, may be connected to each other. In this case, the first bending part 331 and the fifth bending part 371 may be omitted. Further, when the first length extension part 332 and the second length extension part 375 are connected to each other, it is preferable that they correspond to flexible printed circuit board, respectively, because they are substantially perpendicular to each other.

According to various embodiments, an outer layer of at least one of the bending parts may correspond to a shielding layer. In an embodiment, a shielding film may be attached to at least one of the bending parts.

Figure 4:
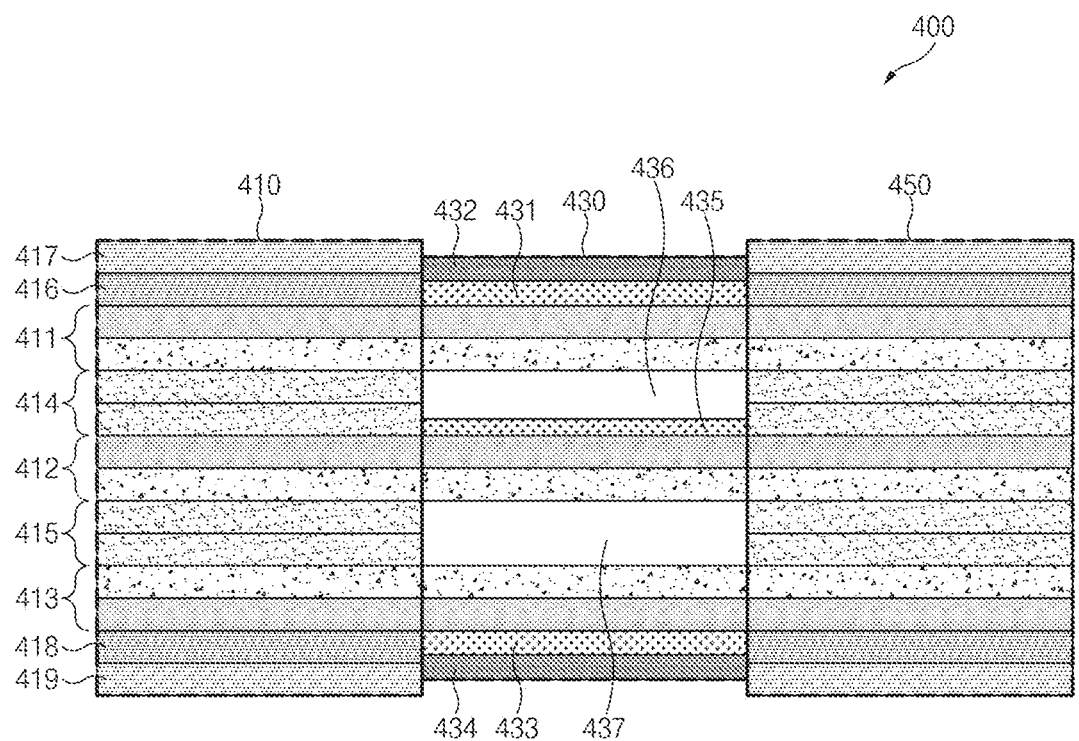
FIG. 4 is a view illustrating a lamination structure of a printed circuit board in an area in which a rigid printed circuit board and a flexible printed circuit board are coupled according to an embodiment of the present disclosure.

FIG. 4 is a view illustrating a lamination structure of a printed circuit board in which a rigid printed circuit board and a flexible printed circuit board are coupled according to an embodiment of the present disclosure.

Referring to FIG. 4, an area of a printed circuit board 400 (for example, the printed circuit board 300) may correspond to a form in which a rigid printed circuit board and a flexible printed circuit board are coupled to each other. For example, the printed circuit board 400 may include at least one rigid part and at least one flexible part. FIG. 4 is a sectional view of an area of the printed circuit board 400 that illustrates a lamination structure in an area in which the rigid part and the flexible part are connected to each other.

The printed circuit board 400 may include a first rigid part 410, a flexible part 430, and a second rigid part 450. According to an embodiment, the first rigid part 410, the flexible part 430, and the second rigid part 450 may correspond to a form in which a plurality of layers is laminated, and at least one layer may be integrally provided. For example, a first copper foil layer 411, a second copper foil layer 412, and a third copper foil layer 413 may be integrally provided in the first rigid part 410, the flexible part 430, and the second rigid part 450. The first copper foil layer 411, the second copper foil layer 412, and the third copper foil layer 413 may be layers in which copper foil is laminated on a polymer layer (for example, a polyimide film) and a circuit line is formed through etching.

According to an embodiment, the first copper foil layer 411, the second copper foil layer 412, and the third copper foil layer 413 may be connected to each other through at least one insulation layer (for example, a prepreg (PPG) layer). For example, a first insulation layer 414 may be situated between the first copper foil layer 411 and the second copper foil layer 412, and a second insulation layer 415 may be situated between the second copper foil layer 412 and the third copper foil layer 413. As another example, in the flexible part 430, the first copper foil layer 411, the second copper foil layer 412, and the third copper foil layer 413 may not be connected to each other due to the insulation layer. For example, in the flexible part 430, a first air layer 436 may be formed by omitting the first insulation layer 414 between the first copper foil layer 411 and the second copper foil layer 412, and a second air layer 437 may be formed by omitting the second insulation layer 415 between the second copper foil layer 412 and the third copper foil layer 413. According to an embodiment, the flexible part 430 may have flexible characteristics due to the characteristics of the air layers. For example, the flexible part 430 may be bent or deflected.

A plating layer and an anti-oxidation layer (for example, a solder resist layer) may be laminated on the upper layers of the copper foil layers laminated in outer regions of the first rigid part 410 and the second rigid part 450. FIG. 4 illustrates that the first plating layer 416 and the first anti-oxidation layer 417 are laminated on the upper layer of the first copper foil layer 411 and the second plating layer 418 and the second anti-oxidation layer 419 are laminated on the upper layer of the third copper foil layer 413.

In the flexible part 430, a cover layer may be laminated on the upper layers of the first copper foil layer 411, the second copper foil layer 412, and the third copper foil layer 413, and a shielding layer that interrupts noise signals may be further laminated on the upper layers of the copper foil layers laminated on the outer region of the flexible part 430. FIG. 4 illustrates that a first cover layer 431 and a first shielding layer 432 are laminated on the upper layer of a first copper foil layer 411, a second cover layer 435 is laminated on the upper layer of the second copper foil layer 412, and a third cover layer 433 and the second shielding layer 434 are laminated on the upper layer of the third copper foil layer 413.

Although FIG. 4 illustrates that the first rigid part 410, the flexible part 430, and the second rigid part 450 include three copper foil layers, the present disclosure is not limited thereto. According to various embodiments, at least one of the first rigid part 410, the flexible part 430, and the second rigid part 450 may further include at least another copper foil layer. According to an embodiment, the flexible part 430 may correspond to three copper foil layers, and the first rigid part 410 and the second rigid part 450 may include eight copper foil layers. In this case, three copper foil layers of the eight copper foil layers included in the first rigid part 410 and the second rigid part 450 may be integrally formed with the three copper foil layers included in the flexible part 430.

According to an embodiment, the first rigid part 410, the flexible part 430, and the second rigid part 450 may utilize one (for example, the second copper foil layer 412) of the copper layers laminated between the outer copper foil layers (for example, the first copper foil layer 411 and the third copper foil layer 413) as a ground layer. Further, a ground layer may be omitted from the flexible part 430, and one of the outer copper foil layers may be utilized as an impedance matching layer for preventing deviation of impedance.

According to an embodiment, the first rigid part 410 may correspond to the second extension part 315 of FIG. 3, the flexible part 430 may correspond to the first bending part 331 of FIG. 3, and the second rigid part 450 may correspond to the first length extension part 332 of FIG. 3. As another example, the first rigid part 410 may correspond to the first mounting part 311 of FIG. 3, the flexible part 430 may correspond to the fifth bending part 371 of FIG. 3, and the second rigid part 450 may correspond to the second length extension part 375 of FIG. 3. In addition, a connection area of the printed circuit board 300 of FIG. 3 in which parts corresponding to the rigid printed circuit board and a part corresponding to the flexible printed circuit board may correspond to a combination of the first rigid part 410, the flexible part 430, and the second rigid part 450.

Figure 5A:
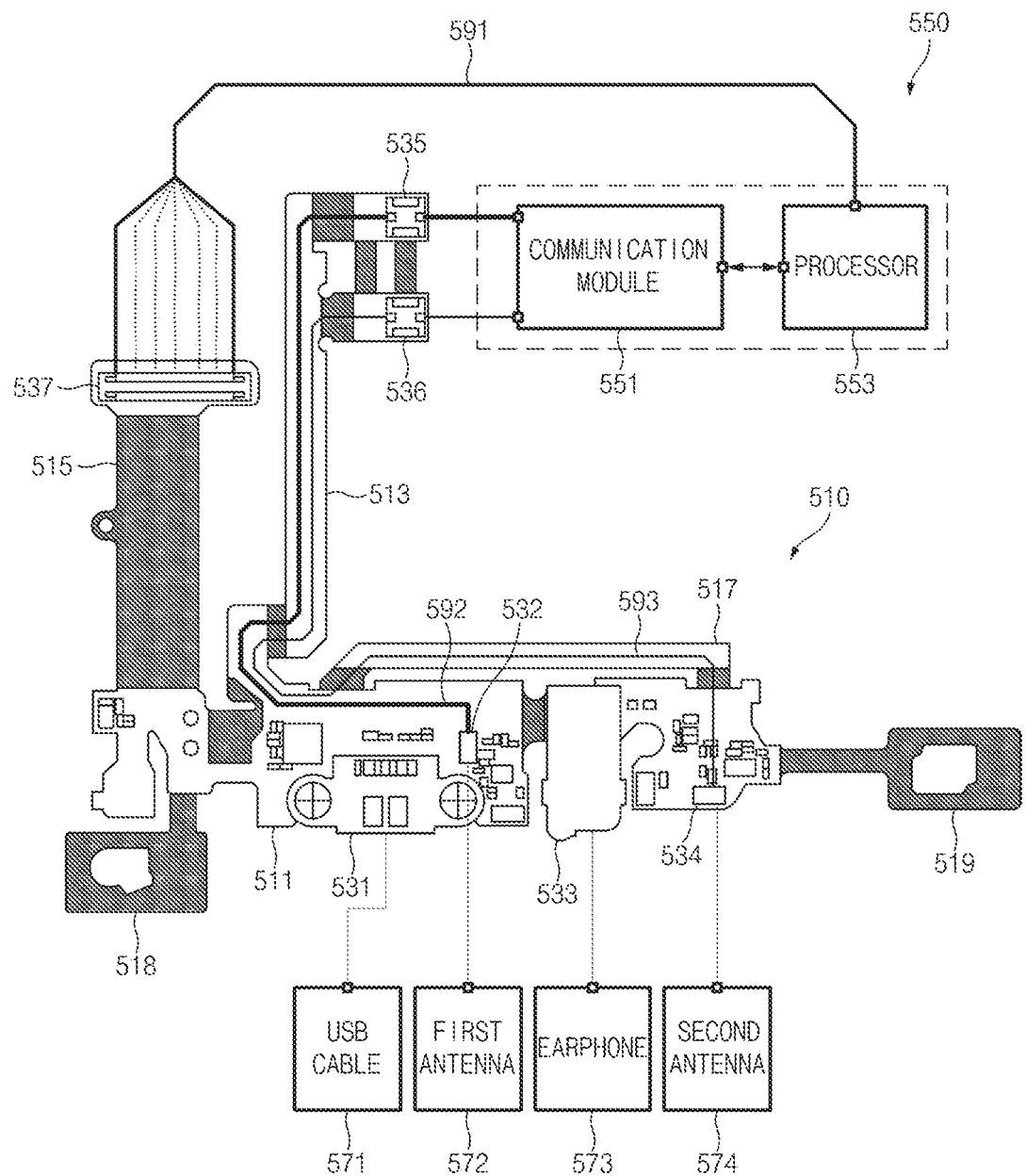
FIG. 5A is a plan view of a printed circuit board in a first form for explaining an arrangement state of signal lines according to an embodiment of the present disclosure.

FIG. 5A is a plan view of a printed circuit board in a first form for explaining an arrangement state of signal lines according to an embodiment of the present disclosure.

Figure 5B:
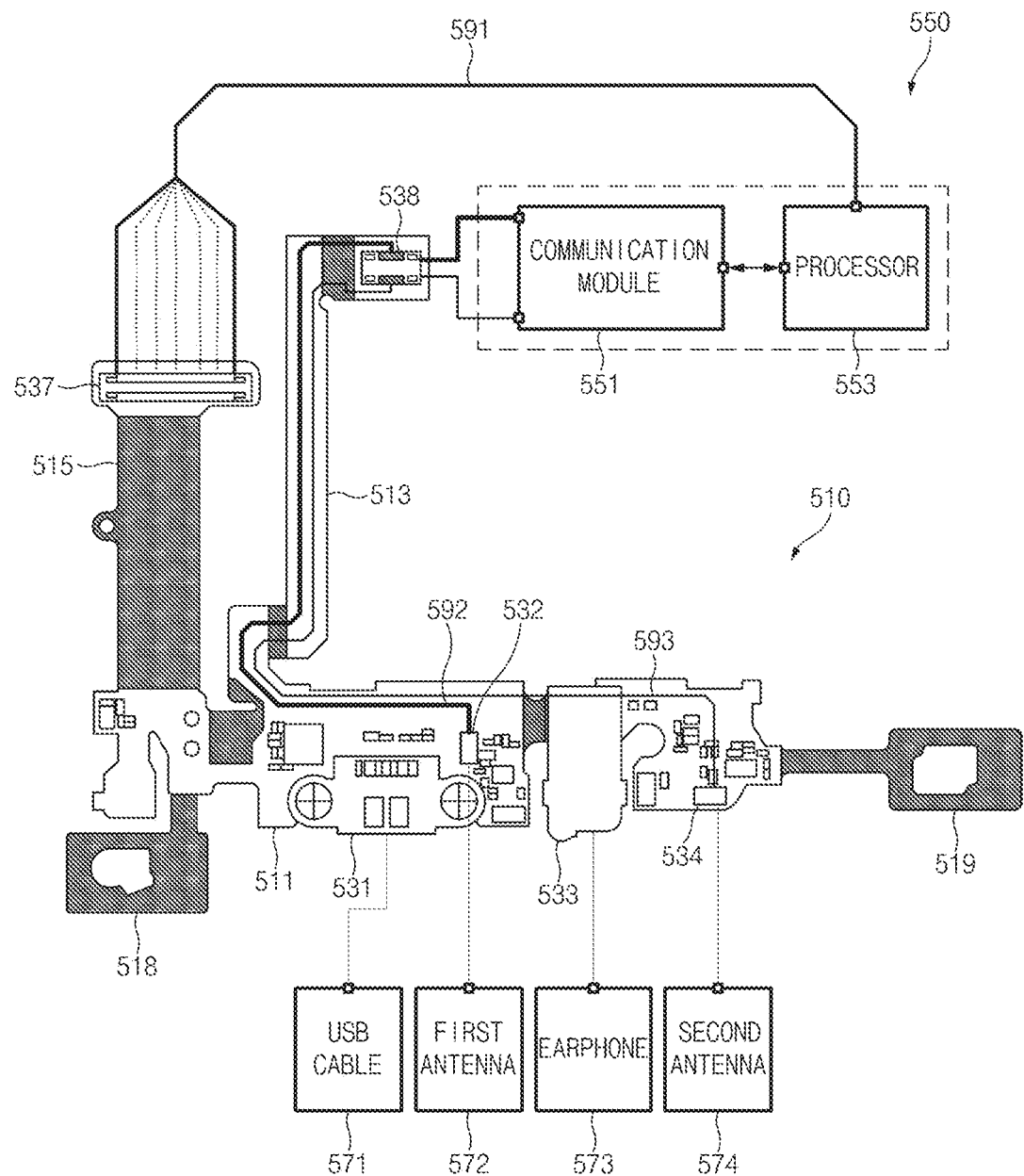
FIG. 5B is a plan view of a printed circuit board in a second form for explaining an arrangement state of signal lines according to an embodiment of the present disclosure.

FIG. 5B is a plan view of a printed circuit board in a second form for explaining an arrangement state of signal lines according to an embodiment of the present disclosure.

Figure 5C:
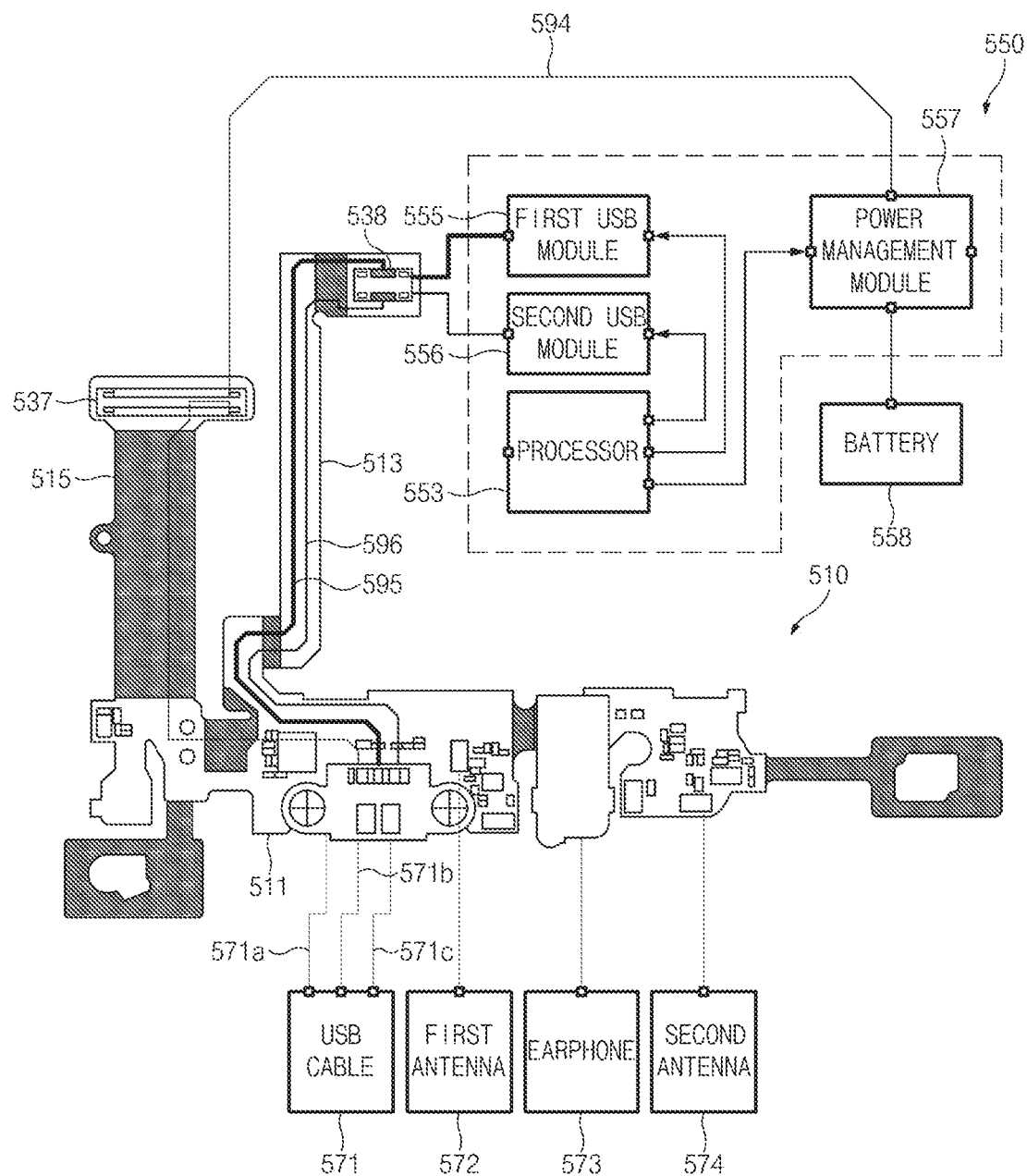
FIG. 5C is a view for explaining another arrangement state of signal lines of the printed circuit board in the second form of FIG. 5B according to an embodiment of the present disclosure.

FIG. 5C is a view for explaining another arrangement state of signal lines of the printed circuit board in the second form of FIG. 5B according to an embodiment of the present disclosure.

Figure 5D:
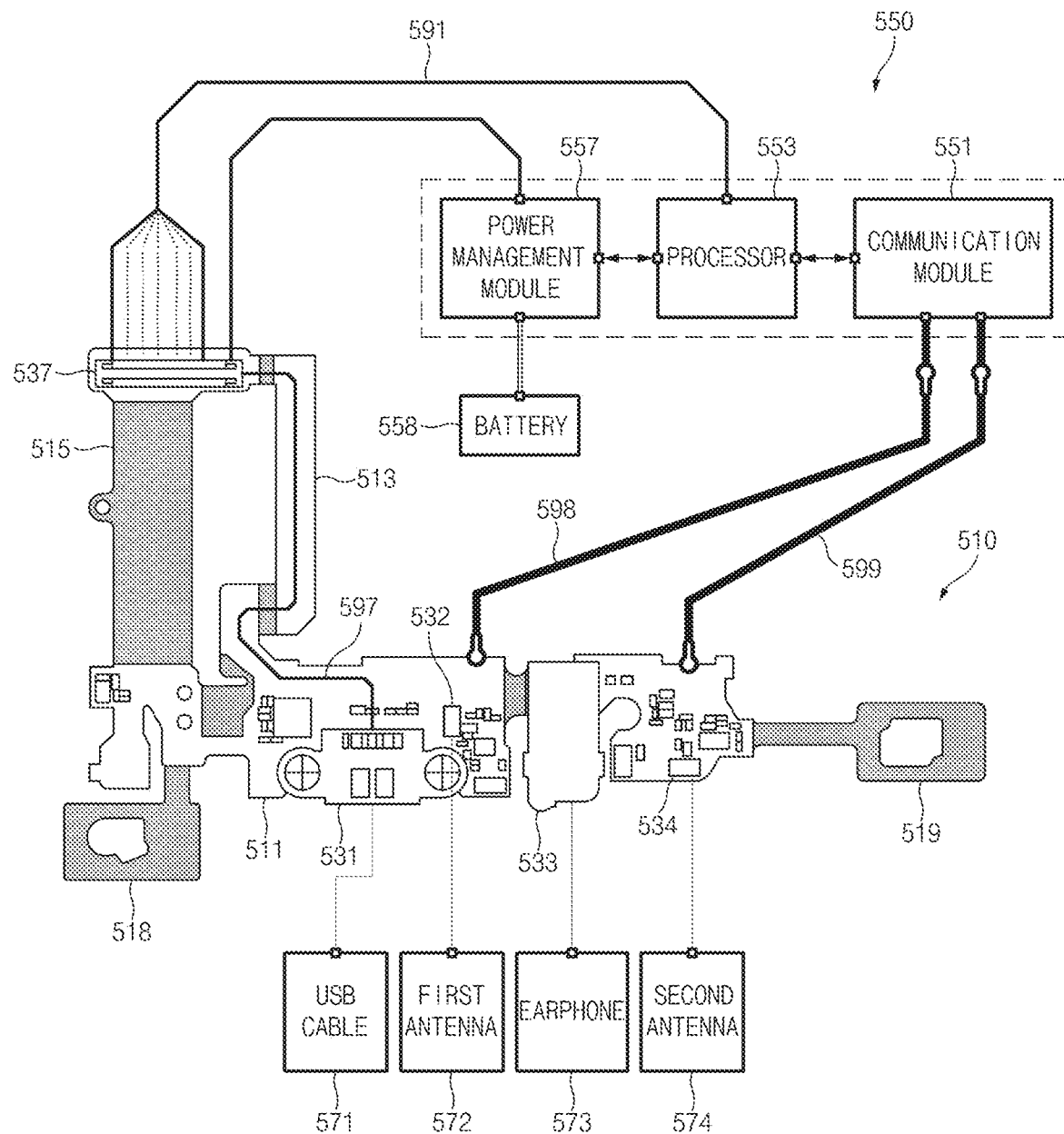
FIG. 5D is a plan view of a printed circuit board in a third form for explaining an arrangement state of signal lines according to an embodiment of the present disclosure.

FIG. 5D is a plan view of a printed circuit board in a third form for explaining an arrangement state of signal lines according to an embodiment of the present disclosure.

Referring to FIGS. 5A to 5D, various electronic components may be mounted on the second printed circuit board 550. According to an embodiment, a communication module 551, a processor 553, a first USB module 555, a second USB module 556, and a power management module 557 may be mounted on the second printed circuit board 550.

The communication module 551 may set a communication between an electronic device (for example, the electronic device 100) and an external device. For example, the communication module 551 may be connected to a network through a wireless or wired communication to communicate with the external device. The communication module 551, for example, may include a cellular module, a Wi-Fi module, a Bluetooth (BT) module, a GNSS module (for example, a global positioning system (GPS) module, a global navigation satellite system (GLONASS) module, a BeiDou module, or a Galileo module), a near field communication (NFC) module, and an RF module.

The cellular module, for example, may provide a voice call, a video call, a text message service, or an Internet service through a communication network. According to an embodiment, the cellular module may include a communication processor. Each of the Wi-Fi module, the BT module, the GNSS module, and the NFC module, for example, may include a processor for processing data transmitted/received through the corresponding module. According to some embodiments, at least some (for example, two or more) of the cellular module, the Wi-Fi module, the BT module, the GNSS module, and the magnetic secure transmission (MST) module may be included in one integrated chip (IC) or IC package.

The RF module, for example, may transmit/receive a communication signal (for example, an RF signal). The RF module 729, for example, may include a transceiver, a power amp module (PAM), a frequency filter, a low noise amplifier (LNA), or an antenna. According to an embodiment, at least one of the cellular module, the Wi-Fi module, the BT module, the GNSS module, or the NFC module may transmit and receive an RF signal through a separate RF module.

The processor 553 may include one or more of a CPU, an AP, or a communication processor (CP). The processor 553, for example, may execute operations or data processing related to the control and/or communication of at least one other element of the electronic device.

The first USB module 555 and the second USB module 556 may function as an interface that may deliver commands or data input from another external device to other elements of the electronic device.

The power management module 557, for example, may manage power of the electronic device. According to an embodiment of the present disclosure, the power management module 557 may include a power management integrated circuit (PMIC), a charger IC, or a battery gauge. The PMIC may have a wired and/or wireless charging scheme. The battery gauge, for example, may measure a power level of the battery 558, and a voltage, a current, or a temperature while charging. The battery 558, for example, may include a rechargeable battery and/or a solar battery.

The first printed circuit board 510 may include a mounting part 511 and a plurality of connectors. Various electronic components may be mounted on the mounting part 511, and the connectors may electrically connect the first printed circuit board 510 and the second printed circuit board 550.

According to an embodiment, the first interface module 531 (for example, a USB connector), the first antenna connection terminal 532, the second interface module 533 (for example, an earphone receptacle), and the second antenna connection terminal 534 may be mounted on the mounting part 511. As another example, ends of the first connector 513 and the second connector 515 included in the first printed circuit board 510 may be connected to the mounting part 511, and opposite ends thereof may be connected to the second printed circuit board 550. As another example, one end of the third connector 517 included in the first printed circuit board 510 may be connected to a part (for example, the first mounting part 311) of the mounting part 511, and an opposite end thereof may be connected to another part (for example, the third mounting part 313) of the mounting part 511.

According to an embodiment, the first connector 513 and the second connector 515 connected to the second printed circuit board 550 may include at least one connection part, and the at least one connection part may be connected to the second printed circuit board 550. As in FIG. 5A, the first connector 513 may include a first connection part 535 and a second connection part 536, and the second connector 515 may include a third connection part 537. Further, as in FIGS. 5B and 5C, the first connector may include a first connection part 535 and a fourth connection part 538 with which the second connection part 536 is integrally provided, and the second connector 515 may include a third connection part 537. As another example, as in FIG. 5D, a connection part may be omitted from the first connector 513, and one end of the first connector 513 may be connected to a third connection part 537 provided at one end of the second connector 515.

Signal lines are formed in the connectors, and the first printed circuit board 510 and the second printed circuit board 550 may be electrically connected to each other through the connectors. Accordingly, if an external device is connected to electronic components mounted on the first mounting part 511, signals may be transmitted and received between the external device and the electronic components mounted on the second printed circuit board 550.

Referring to FIG. 5A, a high-frequency signal (for example, an RF signal) may be transmitted and received through the first connector 513 and/or the third connector 517, and a digital signal (for example, an audio signal, an interface signal (for example, an USB signal), a sensor signal, a key input signal, or a power signal) may be transmitted and received through the second connector 515. For example, at least one of a USB cable 571 connected to the first interface module 531, an earphone 573 connected to the second interface module 533, a first key module 518 mounted on the left area of the mounting part 511, a second key module 519 mounted on the right area of the mounting part 511 may transmit and receive signals to and from the processor 553 mounted on the second printed circuit board 550 through a first signal line 591 formed in the second connector 515. Further, a first antenna 572 connected to the first antenna connection terminal 532 may transmit and receive signals to and from the communication module 551 mounted on the second printed circuit board 550 through a second signal line formed in the first connector 513. Further, a second antenna 574 connected to the second antenna connection terminal 534 may transmit and receive signals to and from the communication module 551 mounted on the second printed circuit board 550 through a third signal line formed in the first connector 513 and the third connector 517.

According to an embodiment, the third connector 517 may be provided when prevention of noise or a design around of signal lines on the first printed circuit board 510 are necessary. Accordingly, as in FIGS. 5B and 5C, the third connector 517 may be omitted from the first printed circuit board 510.

The first printed circuit board 510 illustrated in FIG. 5B may exclude the third connector 517, and may include a fourth connection part 538 with which the first connection part 535 and the second connection part 536 are integrally provided. For example, the first connection part 535 and the second connection part 536 may include a receptacle, and the fourth connection part 538 may include a B-To-B connector.

Referring to FIG. 5B, because the third connector 517 is omitted, the second antenna 574 connected to the second antenna connection terminal 534 may transmit and receive signals to and from the communication module 551 mounted on the second printed circuit board 550 through the third signal line formed in the first connector 513. As another example, the second signal line 592 may be connected to pads on a first surface of the fourth connection part 538, and the third signal line 593 may be connected to pads on a second surface of the fourth connection part 538.

FIG. 5C illustrates an arrangement of signal lines related to transmission and reception of high-speed interface signals (for example, a USB 3.1 signal). Referring to FIG. 5C, if the USB cable 571 (for example, the USB 3.1 cable) is connected to the first interface module 531, a power signal (for example, a USB power signal) is supplied to a first connection line 571a and a power signal may be transmitted to the power management module 557 mounted on the second printed circuit board 550 through the fourth signal line 594 formed in the second connector 515. As another example, a first USB data signal (for example, a general data signal) may be transmitted and received between the first interface module 531 and a USB cable 571 through the second connection line 571b, and may be transmitted and received between the first interface module 531 and a first USB module 555 mounted on the second printed circuit board 550 through a fifth signal line 595 formed in the first connector 513. As another example, a second USB data signal (for example, a high-speed data signal) may be transmitted and received between the first interface module 531 and the USB cable 571 through the third connection line 571c, and may be transmitted and received between the first interface module 531 and the second USB module 556 mounted on the second printed circuit board 550 through a sixth signal line 596 formed in the first connector 513. According to an embodiment, the first interface module 531 may include a USB 3.1 Type-C receptacle or a USB 3.1 Type-C receptacle.

Referring to FIG. 5D, the first connector 513 may be connected to the third connection part 537 provided in the second connector 515. In this case, a slot may be formed between the first connector 513 and the second connector 515. The slot may be provided to space the first connector 513 and the second connector 515 apart from each other by a specific distance. According to an embodiment, a power signal may be transmitted and received through a seventh signal line 597 formed in the first connector 513. As another example, a first antenna 572 connected to the first antenna connection terminal 532 may transmit and receive signals to and from the communication module 551 mounted on the second printed circuit board 550 through an eighth signal line. Further, a second antenna 574 connected to the second antenna connection terminal 534 may transmit and receive signals to and from the communication module 551 mounted on the second printed circuit board 550 through a ninth signal line. According to an embodiment, the eight signal line 598 and the ninth signal line 599 may be formed in separate cables (for example, coaxial cables)

Figure 6A:
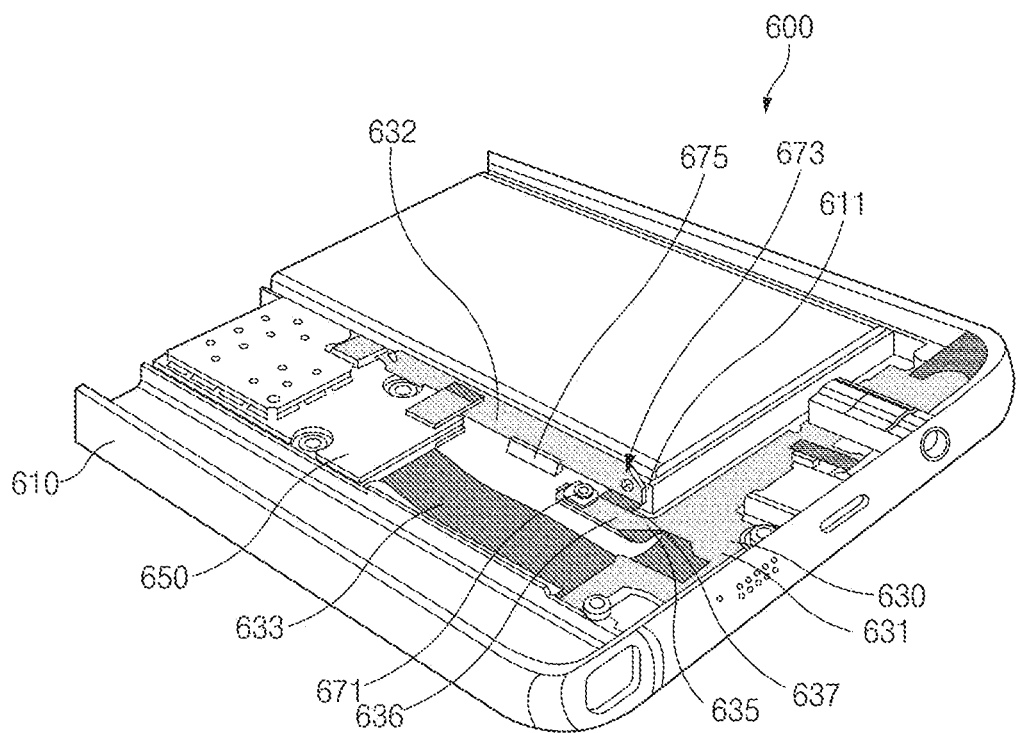
FIG. 6A is a perspective view of a part of an electronic device for explaining a fixed form of a printed circuit board according to an embodiment of the present disclosure.

FIG. 6A is a perspective view of a part of an electronic device for explaining a fixed form of a printed circuit board according to an embodiment of the present disclosure.

Figure 6B:
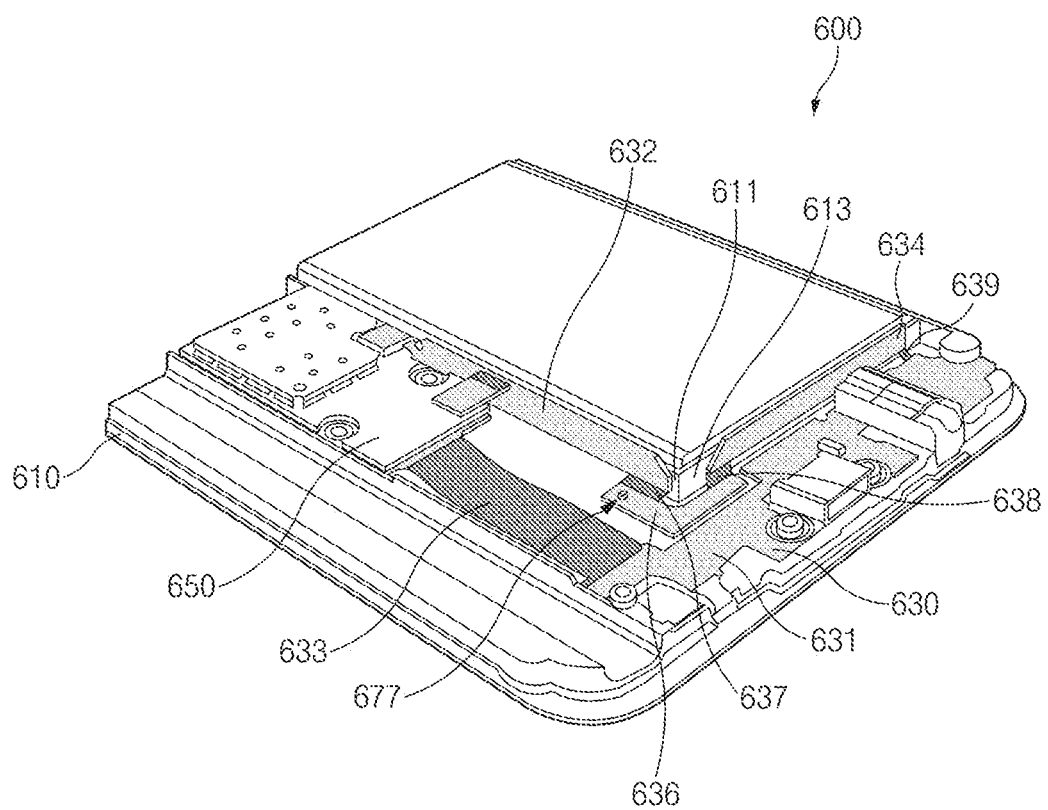
FIG. 6B is a perspective view of a part of an electronic device for explaining another connection form of an extension part according to an embodiment of the present disclosure.

FIG. 6B is a perspective view of a part of an electronic device for explaining another connection form of an extension part according to an embodiment of the present disclosure.

Figure 6C:
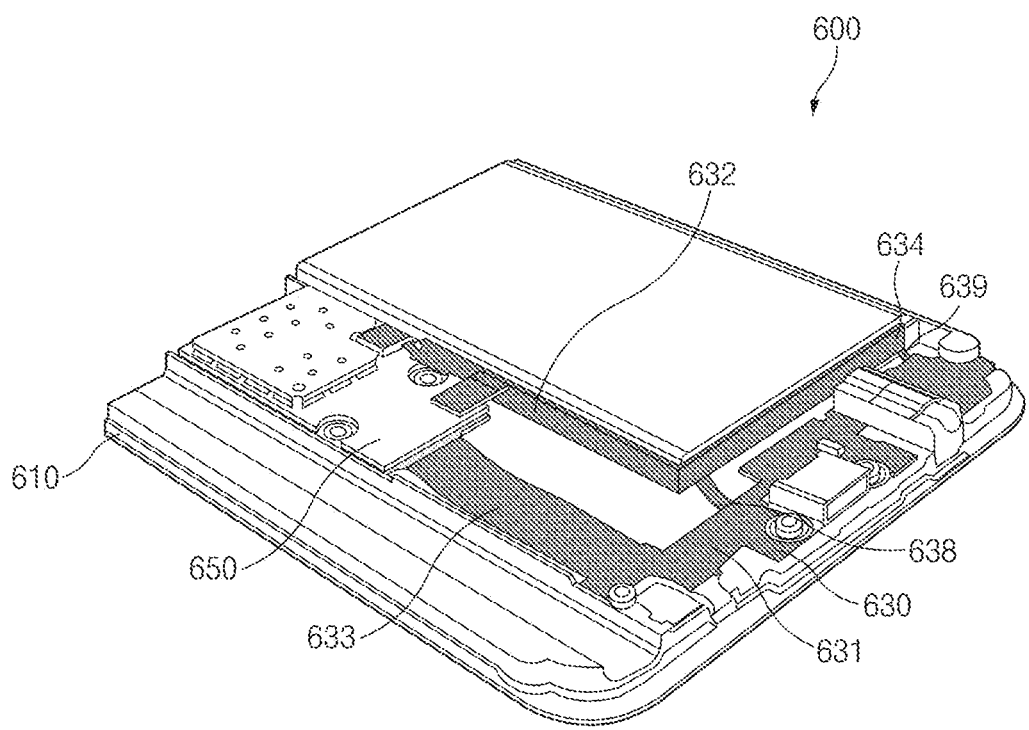
FIG. 6C is a perspective view of a part of an electronic device for explaining a printed circuit board implemented by a flexible printed circuit board according to an embodiment of the present disclosure.

FIG. 6C is a perspective view of a part of an electronic device for explaining a printed circuit board implemented by a flexible printed circuit board according to an embodiment of the present disclosure.

Referring to FIGS. 6A to 6C, the first printed circuit board 630 may include a mounting part 631, a first connector 632, and a second connector 633. According to an embodiment, the mounting part 631 may include a first extension part 635 that extends from a peripheral portion of the mounting part 631, and a second extension part 636 that extends from the first extension part 635 in parallel to a first side wall 611 of a structure provided inside the housing 610. The first connector 632 may be connected to the second extension part 636 through the first bending part 637. As another example, the second connector 633 may connect the mounting part 631 and the second printed circuit board 650.

According to various embodiments, the first printed circuit board 630 may further include a third connector 634.

The third connector 634 may be connected to the mounting part 631 through a second bending part 638 and a third bending part 639.

Referring to FIG. 6A, at least one of a plurality of printed circuit boards seated inside the housing 610 of the electronic device 600 may be fixed to the housing 610 through a fixing member (for example, a screw member). FIG. 6A illustrates that a screw coupling member 671 and a screw coupling hole 673 are provided in the first printed circuit board 630. However, the present disclosure is not limited thereto. According to an embodiment, a fixing member may be included in the second printed circuit board 650. The screw coupling member 671 may be a plate-shaped mechanism having a screw coupling hole to couple a screw member (for example, a screw). As another example, the screw coupling member 671 may be formed of a stainless steel material.

FIG. 6A illustrates that a screw coupling member 671 is provided in the second extension part 636 and a screw coupling hole 673 is provided in the first connector 632. A screw coupling hole 673 is provided in the first connector 632 arranged to be attached to the first side wall 611 of the structure provided inside the housing 610, and when the first side wall 611 is coupled by the screw member, a bonding material or a bonding member may be omitted. As another example, the screw coupling member 671 may be assembled on the second extension part 636 through a surface mounting technology. A stop 675 may be provided to position the first connector 632, as illustrated in FIG. 6A.

Referring to FIG. 6B, the second extension part 636, to which the first bending part 637 is connected, may be arranged to be separated from the mounting part 631. In this case, the first extension part 635 may be omitted. According to an embodiment, the second extension part 636 may be arranged adjacent to the side walls (for example, the first side wall 611 and the second side wall 613) of a mechanism provided inside the housing 610. As another example, the second extension part 636 may be bent at an angle that is the same as or similar to an angle formed by the side walls. For example, the second extension part 636 may be bent at an angle that is the same as or similar to an angle formed by the first side wall 611 and the second side wall 613. As another example, a screw coupling hole 677 that is to be fixed to the housing 610 may be provided in the second extension part 636.

Referring to FIG. 6C, the first printed circuit board 630 may correspond to a flexible printed circuit board. For example, the mounting part 631, the first connector 632, the second connector 633, and the third connector 634 may correspond to a flexible printed circuit board. As another example, the first connector 632 and the third connector 634 may be connected to each other. For example, one end of the first connector 632 and one end of the third connector 634 may be connected to each other. FIG. 6C illustrates that a right periphery of the first connector 632 and a left periphery of the third connector 634 are connected to each other. In this case, the first extension part 635, the second extension part 636, and the first bending part 637 may be omitted.

As described above, according to various embodiments, there is provided an electronic device including a housing (for example, the housing 110) including a first surface that faces a first direction, a second surface that faces a second direction opposite to the first direction, and a side surface that surrounds at least a portion of a space between the first surface and the second surface, a first printed circuit board (for example, the first printed circuit board 130) seated inside the housing, and a second printed circuit board (for example, the second printed circuit board 150) seated inside the housing such that a height of the second printed circuit board from the second surface is different from that of the first printed circuit board, wherein the first printed circuit board includes a mounting part (for example, the mounting part 131) on which at least one component is mounted, a first connector (for example, the first connector 133) which extends from a first part of the mounting part and a portion of which is disposed to be substantially perpendicular to the mounting part to be connected to the second printed circuit board, and a second connector (for example, the second connector 135) which extends from a second part of the mounting part to be connected to the second printed circuit board.

According to various embodiments, the first connector includes a first bending part (for example, the first bending part 271) that extends from the mounting part, a length extension part (for example, the length extension part 273) that extends from the first bending part towards the second printed circuit board by a length, at least one second bending part (for example, the second bending part 275 and the third bending part 279) that extends from the length extension part, and at least one connection part (for example, the first connection part 277) connected to the at least one second bending part and provided to be connected to the second printed circuit board.

According to various embodiments, the length extension part may be spaced apart from one surface of the housing, on which the mounting part is disposed, and a portion of the first bending part may be bent towards the length extension part.

According to various embodiments, the first bending part and the second bending part may include flexible printed circuit boards, respectively, and the length extension part may include a rigid printed circuit board.

According to various embodiments, the second bending part may be longer than a spacing distance between the length extension part and the at least one connection part, and may be bent to protrude upward or downwards in a direction perpendicular to one surface of the housing, on which the mounting part is disposed.

According to various embodiments, the length extension part may be disposed to be attached to an inner surface of the housing or a side wall (for example, the side wall 211) of a structure provided inside the housing.

According to various embodiments, the structure may include a battery frame.

According to various embodiments, the mounting part may include a first extension part (for example, the first extension part 635) that extends from a peripheral portion of the mounting part to be adjacent to a corner to which side walls of the structure are connected, by a length, and a second extension part (for example, the second extension part 636) that extends from the first extension part in parallel a side wall, to which the length extension part is attached, by a length.

According to various embodiments, the first bending part may connect the second extension part and the length extension part.

According to various embodiments, at least one of the first extension part and the second extension part may include a screw coupling member (for example, the screw coupling member 671) having a screw coupling hole, and a screw member may be inserted into the screw coupling hole to fix at least one of the first extension part and the second extension part to the housing.

According to various embodiments, the length extension part may include a screw coupling hole (for example, the screw coupling hole 673), and a screw member may be inserted into the screw coupling hole to fix the length extension part to the inner surface of the housing or the side wall of the structure.

According to various embodiments, the second connector may include a bending part (for example, the fourth bending part 291) that extends from the mounting part, and a connection part (for example, the second connection part 293) connected to the bending part and provided to be connected to the second printed circuit board.

According to various embodiments, the bending part may include a flexible printed circuit board, and a portion of the bending part is bent towards the second printed circuit board.

According to various embodiments, the first connector may include a first signal line for transmitting and receiving a first signal, and the second connector may include a second signal line for transmitting and receiving a second signal.

According to various embodiments, the first signal may include at least one of a high-frequency signal, a high-speed interface signal, and a power signal, and the second signal includes a digital signal.

According to various embodiments, the first signal may include a data signal inputted through an interface module, and the second signal may include a power signal inputted through the interface module.

According to various embodiments, the electronic device may further include a third connector (for example, the third connector 137) which extends from a third part of the mounting part to be connected to a fourth part of the mounting part.

According to various embodiments, the third connector may include a first bending part (for example, the fifth bending part 371) that extends from the third part of the mounting part, a length extension part (for example, the second length extension part 375) that extends from the first bending part towards the fourth part of the mounting part by a length, and a second bending part (for example, the sixth bending part 373) that extends from the fourth part of the mounting part to be connected to the length extension part, by a length.

According to various embodiments, the length extension part may be disposed to be attached to an inner surface of the housing or a side wall of a structure provided inside the housing.

According to various embodiments, the first connector and the third connector may be integrally provided.

Figure 7:
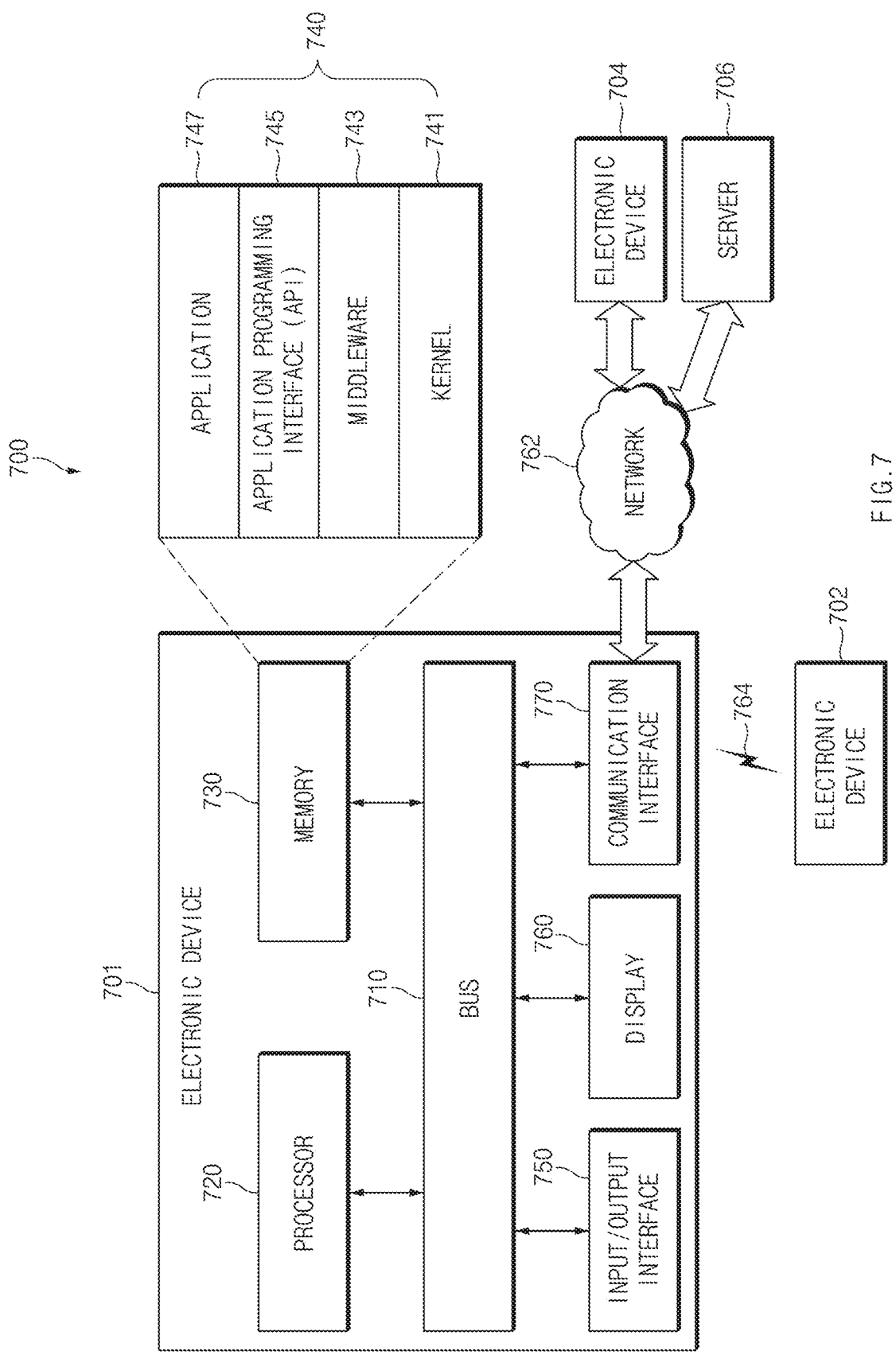
FIG. 7 is a view of an electronic device in a network environment according to various embodiments of the present disclosure.

FIG. 7 illustrates an electronic device 701 in a network environment 700 according to various embodiments of the present disclosure. The electronic device 701 illustrated in FIG. 7 may include a configuration that is the same as or similar to that of the electronic device 100 of FIG. 1.

Referring to FIG. 7, the electronic device 701 may include a bus 710, a processor 720, a memory 730, an input/output interface 750, a display 760, and a communication interface 770. In some embodiments, the electronic device 701 may exclude at least one of the elements or may additionally include another element. The bus 710 may include, for example, a circuit that connects the components 710 to 770 and transfers communications (for example, control messages and/or data) between the components. The processor 720 may include one or more of a CPU, an AP, or a CP. The processor 720, for example, may execute operations or data processing related to the control and/or communication of at least one other component of the electronic device 701.

The memory 730 may include volatile and/or nonvolatile memories. The memory 730, for example, may store a command or data related to at least one other component of the electronic device 701. According to an embodiment, the memory 730 may store software and/or a program 740. The program 740, for example, may include a kernel 741, middleware 743, an application programming interface (API) 745, and/or an application program(s) (or application(s)) 747. At least some of the kernel 741, the middleware 743, or the API 745 may be referred to as an operating system (OS). The kernel 741, for example, may control or manage system resources (for example, the bus 710, the processor 720, and the memory 730) that are used to execute operations or functions implemented in the other programs (for example, the middleware 743, the API 745, or the applications 747). The kernel 741 may provide an interface through which the middleware 743, the API 745, or the applications 747 access individual components of the electronic device 701 to control or manage the system resources.

The middleware 743, for example, may function as an intermediary that allows the API 745 or the applications 747 to communicate with the kernel 741 to exchange data. The middleware 743 may process one or more work requests received from the application programs 747, according to their priorities. For example, the middleware 743 may give a priority, by which a system resource (for example, the bus 710, the processor 720, or the memory 730) of the electronic device 701 may be used, to at least one of the application programs 747 and process the one or more request for work. The API 745 is an interface used, by the applications 747, to control a function provided from the kernel 741 or the middleware 743, and may include, for example, at least one interface or function (for example, instruction) for file control, window control, image processing, and text control. The input/output interface 750, for example, may deliver commands or data input from the user or another external device to another element(s) of the electronic device 701, or may output commands or data received from another element(s) of the electronic device 701 to the user or another external device.

According to an embodiment of the present disclosure, the display 760 may include a liquid crystal display (LCD), a light emitting diode (LED) display, an organic LED (OLED) display, a micro electromechanical system (MEMS) display, and an electronic paper display. The display 160, for example, may display various contents (for example, a text, an image, a video, an icon, and a symbol). The display 760 may include a touch screen and receive, for example, a touch, a gesture, a proximity, or a hovering input using an electronic pen or the user's body. The communication interface 770, for example, may set communication between the electronic device 701 and an external device (for example, a first external electronic device 702, a second external electronic device 704, or a server 706). For example, the communication interface 770 may be connected to a network 762 through a wireless communication or a wired communication to communicate with the external device (for example, the second external electronic device 704 or the server 706). The communication interface 770 may communicate with the first external electronic device 702 via a wireless communication 764, as illustrated in FIG. 7.

The wireless communication, for example, may include a cellular communication that uses at least one of long-term evolution (LTE), LTE-advanced (LTE-A), code division multiple access (CDMA), wideband CDMA (WCDMA), an universal mobile telecommunications system (UMTS), wireless broadband (WiBro), or a global system for mobile communications (GSM). According to an embodiment, the wireless communication, for example, may include at least one of Wi-Fi, BT, BT low energy (BLE), ZigBee, NFC, MST, RF, or a body airless network (BAN) According to an embodiment, the wireless communication may include GNSS. The GNSS, for example, may be a GPS, a GLO-NASS, a BeiDou navigation satellite system (hereinafter, "BeiDou"), or the European global satellite-based navigation system (Galileo). Hereinafter, in the present disclosure, the "GPS" may be interchangeably used with the "GNSS". The wired communication may include at least one of, for example, a USB, a high definition multimedia interface (HDMI), recommended standard-232 (RS-232), and a plain old telephone service (POTS). The network 762 may include at least one of communication networks, for example, a computer network (for example, a local area network (LAN) or a wireless area network (WAN)), the internet, or a telephone network.

The first and second external electronic devices 702 and 704 may be the same or different type devices from the electronic device 701. According to various embodiments of the present disclosure, all or some of the operations executed by the electronic device 701 may be executed by another or a plurality of electronic devices (for example, the electronic devices 702 and 704 or the servers 706). According to an embodiment of the present disclosure, when the electronic device 701 should execute some functions or services automatically or upon request, it may request at least some functions associated with the functions or services from another device (for example, the electronic devices 702 and 704 or the server 706), in place of or in addition to directly executing the functions or services. The other electronic device (for example, the electronic device 702 or 704 or the server 706) may execute a requested function or an additional function, and may transfer the result to the electronic device 701. The electronic device 701 may process the received result directly or additionally, and may provide a requested function or service. To this end, for example, the cloud computing, distributed computing, or client-server computing technologies may be used.

Figure 8:
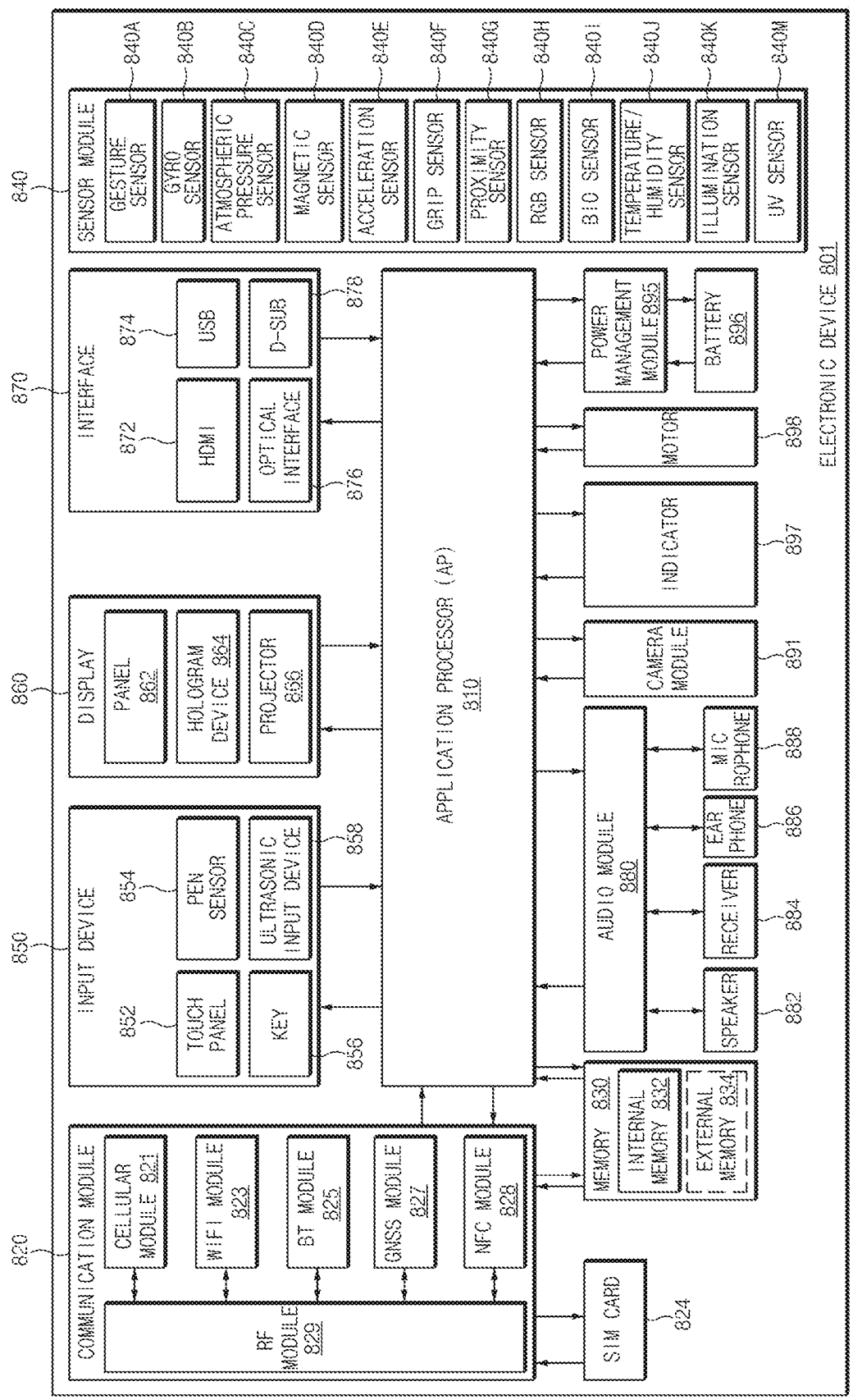
FIG. 8 is a block diagram of an electronic device according to various embodiments of the present disclosure.

FIG. 8 is a block diagram of an electronic device 801 according to various embodiments of the present disclosure. An electronic device 801 may include, for example, the entirety or a part of the electronic device 701 illustrated in FIG. 7.

Referring to FIG. 8, the electronic device 801 may include at least one processor (for example, an AP 810), a communication module 820, a subscriber identification module (SIM) card 824, a memory 830, a sensor module 840, an input device 850, a display 860, an interface 870, an audio module 880, a camera module 891, a power management module 895, a battery 896, an indicator 897, or a motor 898. The processor 810 may control a plurality of hardware or software components connected to the processor 810 by driving an operating system or an application program and perform a variety of data processing and calculations. The processor 810 may be implemented by, for example, a system on chip (SoC). According to an embodiment, the processor 810 may further include a graphics processing unit (GPU) and/or an image signal processor. The processor 810 may include at least some (for example, a cellular module 821) of the components illustrated in FIG. 8. The processor 810 may load instructions or data, received from at least one other component (for example, a non-volatile memory), in a volatile memory to process the loaded instructions or data, and may store various types of data in a non-volatile memory.

The communication module 820 may have the same or similar structure to the communication interface 770 of FIG. 7. The communication module 820 may include, for example, a cellular module 821, a Wi-Fi module 823, a BT module 825, a GPS module 827, an NFC module 828, and an RF module 829. The cellular module 821 may provide a voice call, a video call, a text message service, or an internet service through, for example, a communication network. According to an embodiment, the cellular module 821 may distinguish between and authenticate electronic devices 801 within a communication network using a subscriber identification module (for example, the SIM card 824). According to an embodiment, the cellular module 821 may perform at least some of the functions that the processor 810 may provide. According to an embodiment of the present disclosure, the cellular module 821 may include a CP. According to some embodiments, at least some (two or more) of the cellular module 821, the Wi-Fi module 823, the BT module 825, the GNSS or GPS module 827, and the NFC module 828 may be included in one IC or IC package. The RF module 829 may transmit/receive, for example, a communication signal (for example, an RF signal). The RF module 829 may include, for example, a transceiver, a PAM, a frequency filter, a LNA, or an antenna. According to an embodiment of the present disclosure, at least one of the cellular module 821, the Wi-Fi module 823, the BT module 825, the GPS module 827, and the NFC module 828 may transmit/receive an RF signal through a separate RF module. The subscriber identification module 824 may include, for example, a card including a subscriber identification module and/or an embedded SIM, and may further include unique identification information (for example, an IC card identifier (ICCID)) or subscriber information (for example, international mobile subscriber identity (IMSI)).

The memory 830 (for example, the memory 730) may include, for example, an internal memory 832 or an external memory 834. The internal memory 832, for example, may include at least one of a volatile memory (for example, a dynamic random access memory (DRAM), a static RAM (SRAM), or a synchronous DRAM (SDRAM)), a nonvolatile memory (for example, a one time programmable read only memory (OTPROM), a PROM, an erasable PROM (EPROM), an electrically erasable PROM (EEPROM), a mask ROM, a flash ROM, a flash memory, a hard drive, or a solid state drive (SSD). The external memory 834 may further include a flash drive, for example, a compact flash (CF), a secure digital (SD), a micro-SD, a mini-SD, an extreme digital (xD), a memory stick, or the like. The external memory 834 may be functionally and/or physically connected to the electronic device 801 through various interfaces.

The sensor module 840, for example, may measure a physical quantity or detect an operational state of the electronic device 801, and may convert the measured or detected information to an electrical signal. The sensor module 840 may include, for example, at least one of a gesture sensor 840A, a gyro sensor 840B, an atmospheric pressure sensor 840C, a magnetic sensor 840D, an acceleration sensor 840E, a grip sensor 840F, a proximity sensor 840G, a color sensor 840H (for example, red, green, and blue (RGB) sensor), a biometric (BIO) sensor 840I, a temperature/humidity sensor 840J, an illumination sensor 840K, and an ultraviolet (UV) sensor 840M. Additionally or alternatively, the sensor module 840 may include an electronic nose (E-nose) sensor, an electromyography (EMG) sensor, an electroencephalography (EEG) sensor, an electrocardiography (ECG) sensor, an infrared (IR) sensor, an iris sensor, and/or a fingerprint sensor. The sensor module 840 may further include a control circuit for controlling one or more sensors included therein. In some embodiments, the electronic device 801 may further include a processor configured to control the sensor module 840 as a part of or separately from the processor 810, and may control the sensor module 840 while the processor 810 is in a sleep state.

The input device 850 may include, for example, a touch panel 852, a (digital) pen sensor 854, a key 856, or an ultrasonic input device 858. The touch panel 852 may use at least one of, for example, a capacitive type, a resistive type, an infrared type, and an ultrasonic type. The touch panel 852 may further include a control circuit. The touch panel 852 may further include a tactile layer, and provide a tactile reaction to a user. The (digital) pen sensor 854 may include, for example, a recognition sheet which is a part of the touch panel or a separate recognition sheet. The key 856 may include, for example, a physical button, an optical key, or a keypad. The ultrasonic input device 858 may detect ultrasonic waves generated by an input tool through a microphone (for example, a microphone 888) and may identify data corresponding to the detected ultrasonic waves.

The display 860 (for example, the display 760) may include a panel 862, a hologram device 864, a projector 866, and/or a control circuit for controlling them. The panel 862 may be implemented to be, for example, flexible, transparent, or wearable. The panel 862 may be formed as a single module together with the touch panel 852. According to an embodiment, the panel 862 may include a pressure sensor (for a force sensor) that may measure the strength of a pressure for a touch of the user. The pressure sensor may be implemented integrally with the touch panel 852 or may be implemented by one or more sensors that are separate from the touch panel 852. The hologram device 864 may show a three dimensional image in the air using an interference of light. The projector 866 may display an image by projecting light onto a screen. The screen may be located, for example, in the interior of or on the exterior of the electronic device 801. The interface 870 may include, for example, an HDMI 872, a USB 874, an optical interface 876, or a D-subminiature (D-sub) 878. The interface 870 may be included in, for example, the communication interface 770 illustrated in FIG. 7. Additionally or alternatively, the interface 870 may include, for example, a mobile high-definition link (MHL) interface, an SD card/multimedia card (MMC) interface, or an infrared data association (IrDA) standard interface.

The audio module 880 may bilaterally convert, for example, a sound and an electrical signal. At least some elements of the audio module 880 may be included in, for example, the input/output interface 750 illustrated in FIG. 7. The audio module 880 may process sound information input or output through, for example, a speaker 882, a receiver 884, earphones 886, the microphone 888, or the like. The camera module 891 is a device which may photograph a still image and a dynamic image. According to an embodiment, the camera module 891 may include one or more image sensors (for example, a front sensor or a back sensor), a lens, an image signal processor (ISP) or a flash (for example, an LED or xenon lamp). The power management module 895 may manage, for example, power of the electronic device 801. According to an embodiment, the power management module 895 may include a PMIC, a charger IC, or a battery or fuel gauge. The PMIC may have a wired and/or wireless charging scheme. Examples of the wireless charging method may include, for example, a magnetic resonance method, a magnetic induction method, an electromagnetic wave method, and the like. Additional circuits (e.g., a coil loop, a resonance circuit, a rectifier, etc.) for wireless charging may be further included. The battery gauge may measure, for example, a residual quantity of the battery 896, and a voltage, a current, or a temperature while charging. The battery 896, for example, may include a rechargeable battery and/or a solar battery.

The indicator 897 may indicate particular status of the electronic device 801 or a part thereof (for example, the processor 810), for example, a booting status, a message status, a charging status, or the like. The motor 898 may convert an electrical signal into mechanical vibrations, and may generate a vibration or haptic effect. The electronic device 801 may include a processing unit (for example, a GPU) for supporting mobile TV may process, for example, media data pursuant to a certain standard of digital multimedia broadcasting (DMB), digital video broadcasting (DVB), or media flow (mediaFlo™). Each of the elements described in the specification may include one or more components, and the terms of the elements may be changed according to the type of the electronic device. In various embodiments, the electronic device (for example, the electronic device 801) may exclude some elements or may further include additional elements, or some of the elements may be coupled to each other to constitute one entity such that the functions of the elements before the coupling may be performed in the same way.

Figure 9:
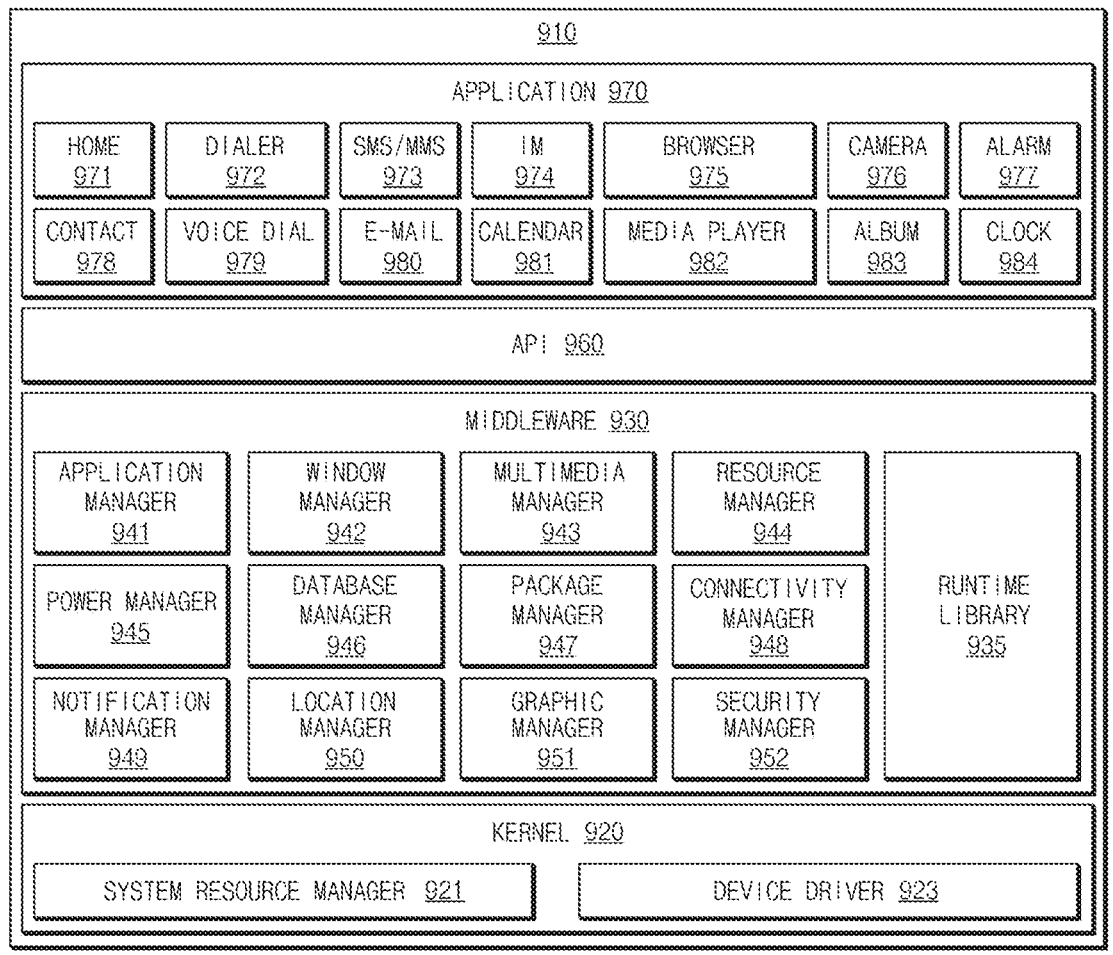
FIG. 9 is a block diagram of a program module according to various embodiments of the present disclosure.

FIG. 9 is a block diagram of a program module 910 according to various embodiments of the present disclosure.

According to an embodiment, the program module 910 (for example, a program 740) may include an OS that controls resources related to an electronic device (for example, the electronic device 701), and various application programs (for example, an application program 747) that is driven on an operating system. The operating system, for example, may include Android™, iOS™, Windows™, Symbian™, Tizen™, or Bada™.

Referring to FIG. 9, the program module 910 may include a kernel 920 (for example, the kernel 741), middleware (for example, the middleware 743), an API 960 (for example, the API 945), and/or an application (for example, the application program 747). At least a part of the program module 910 may be preloaded on an electronic device or may be downloaded from external electronic devices (for example, external electronic devices 702 and 704 and a server 706).

The kernel 920 may include, for example, a system resource manager 921 and/or a device driver 923. The system resource manager 921 may control, allocate, or retrieve the system resources. According to an embodiment, the system resource manager 921 may include a process management unit, a memory management unit, or a file system management unit. The device driver 923 may include, for example, a display driver, a camera driver, a BT driver, a shared-memory driver, a USB driver, a keypad driver, a Wi-Fi driver, an audio driver, or an inter-process communication (IPC) driver. The middleware 930 may provide a function required by the applications 970 in common or provide various functions to the applications 970 through the API 960 so that the applications 970 can efficiently use limited system resources of the electronic device. According to an embodiment, the middleware 930 may include at least one of a runtime library 935, an application manager 941, a window manager 942, a multimedia manager 943, a resource manager 944, a power manager 945, a database manager 946, a package manager 947, a connectivity manager 948, a notification manager 949, a location manager 950, a graphic manager 951, or a security manager 952.

The run time library 935 may include, for example, a library module that a compiler uses in order to add new functions through a programming language while the applications 970 are executed. The run time library 935 may perform input/output management, memory management, or a function for an arithmetic function. The application manager 941, for example, may manage the lifecycles of the applications 970. The window manager 942 may manage a graphical user interface (GUI) resource used in a screen. The multimedia manager 943 may detect a format required for reproducing various media files and encode or decode a media file using a codec appropriate for the corresponding format. The resource manager 944 may manage a source code of the application 970 or a space of a memory. The power manager 945, for example, may manage the power level of the battery or a power source, and may provide power information necessary for an operation of an electronic device. According to an embodiment, the power manager 945 may interwork with a basic input/output system (BIOS). The database manager 946, for example, may generate, search, or change a database to be used by the applications 970. The package manager 947 may manage the installation or the updating of applications distributed in a package file form.

The connectivity manager 948, for example, may manage a wireless connection. The notification manager 949, for example, may provide an event such as an arrival message, a promise, and a notification of proximity to the user. The location manager 950, for example, may manage location information of the electronic device. The graphic manager 951 may manage graphic effects to be provided to a user and user interfaces related to the graphic effects. The security manager 952, for example, may provide a system security or a user authentication. According to an embodiment, the middleware 930 may include a telephony manager for managing a voice or image communication function of the electronic device or a middle module for forming a combination of the functions of the aforementioned elements. According to an embodiment, the middleware 930 may provide modules specialized according to the type of an operating system. Some existing components may be dynamically removed from the middleware 930, or new components may be added to the middleware 930. The API 960 is, for example, a set of API programming functions, and may be provided another configuration according to an operating system. For example, for each platform, one API set may be provided in a case of Android or iOS, and two or more API sets may be provided in a case of Tizen.

The application 970 (for example, the application program 1347) may include, for example, a home 971, a dialer 972, a short message service (SMS)/multimedia messaging service (MMS) 973, an instant message (IM) 974, a browser 975, a camera 976, an alarm 977, a contact 978, a voice or sound dial 979, an e-mail 980, a calendar 981, a media player 982, an album 983, a clock 984, or at least one application that may provide health care (for example, measuring an exercise degree or blood glycose) or environmental information. According to an embodiment, the application 970 may include an information exchange application that may support exchange of information between an electronic device and an external electronic device. The information exchange application, for example, may include a notification relay application for delivering specific information to an external electronic device or a device management application for managing an external electronic device. For example, the notification relay application may deliver notification information generated by another application of the electronic device to an external electronic device, or may receive notification information from an external electronic device and provide the received notification information to the user. The device management application, for example, ma install, delete, or update a function (of turning on or off an external electronic device itself (or an element component) or adjusting the brightness (or resolution) of a display) of an external device that communicates with an electronic device, or an application operated by an external electronic device. According to an embodiment, the application 970 may include an application (for example, a health management application) designated according to an attribute of an external electronic device. According to an embodiment of the present disclosure, the application 970 may include an application received from an external electronic device. At least a part of the program module 910 may be implemented (for example, executed) by software, firmware, hardware (for example, the processor 810) or a combination of two or more of them, and may include a module, a program, a routine, an instruction set, or a process for performing one or more functions.

The term "module" used in the present disclosure may include a unit configured in a hardware, software, or firmware way, and for example, may be used interchangeably with the terms such as logic, a logic block, a component, or a circuit. The "module" may be an integral component, or a minimum unit or a part which performs one or more functions. The "module" may be implemented mechanically or electronically, and for example, may include an application-specific IC (ASIC) chip, field-programmable gate arrays (FPGAs), or a programmable logic device that is known or to be developed in the future, which performs some operations. At least some of the devices (for example, modules or functions) or methods (for example, operations) according to various embodiments of the present disclosure may be implemented by an instruction stored in a computer-readable storage medium (for example, the memory 730), for example, in the form of a program module. When the instruction is executed by the processor (for example, the processor 720), the at least one processor may perform a function corresponding to the instruction. The computer-readable recording medium may include a hard disk, a floppy disk, a magnetic medium (for example, a magnetic tape), an optical recording medium (for example, a compact disc ROM (CD-ROM) or a DVD), a magneto-optical medium (for example, a floptical disk), and an embedded memory. The instruction may include a code made by a compiler or a code that may be executed by an interpreter. The module or program module according to various embodiments of the present disclosure may include at least one of the above-mentioned elements, omit some of them, or further include other elements. The operations performed by a module, a program module, or another element according to various embodiments may be executed sequentially, in parallel, repeatedly, or heuristically, or at least some operations may be executed in another sequence or may be omitted, or another operation may be added.

According to embodiments of the present disclosure, a mounting space for electronic components or an arrangement space for mechanisms may be secured by arranging some of connectors in a height wise direction of the electronic device.

According to embodiments of the present disclosure, material costs may be reduced by implementing a transmission line for transmitting and receiving a high-frequency signal on a printed circuit board, making it possible to increase manufacturing efficiency.

Further, according to embodiments of the present disclosure, a distribution design according to the characteristics of signals may be allowed by transmitting and receiving signals of different characteristics through signal lines formed in the connectors.

In addition, the present disclosure may provide various effects that are directly or indirectly recognized.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
    a housing comprising:
        a first surface that faces a first direction,
        a second surface that faces the first surface, and
        a side surface between the first surface and the second surface;
    a first printed circuit board disposed between the first surface and the second surface and including a mounting part on which at least one component is mounted;
    a second printed circuit board disposed between the first printed circuit board and the first surface such that a height of the second printed circuit board in the first direction from the second surface is different from that of the first printed circuit board; and
    a first connector connecting the first printed circuit board and the second printed circuit board,
    wherein the first connector includes:
        a first bending part that extends from a first part of the mounting part of the first printed circuit board,
        a length extension part that extends from the first bending part, and
        a second bending part that extends from the length extension part to the second printed circuit board, the second bending part pushes the length extension part toward the side surface,
    wherein the first bending part or the second bending part extend at least partially in the first direction, and
    wherein the length extension part extends in a second direction different from the first direction.

2. The electronic device of claim 1,
    wherein the second direction is perpendicular to the first direction, and
    wherein at least one of the first bending part and the second bending part includes a curved surface.

3. The electronic device of claim 1,
    wherein the length extension part is spaced apart from one surface of the housing, on which the mounting part is disposed, and
    wherein a portion of the first bending part is bent towards the length extension part.

4. The electronic device of claim 1,
    wherein the first bending part and the second bending part comprise flexible printed circuit boards, respectively, and
    wherein the length extension part comprises a rigid printed circuit board.

5. The electronic device of claim 1,
    wherein the second bending part is longer than a spacing distance between the length extension part and at least one connection part, and
    wherein the second bending part is bent to protrude upwards or downwards in a direction perpendicular to one surface of the housing, on which the mounting part is disposed.

6. The electronic device of claim 1, wherein the length extension part is disposed to be attached to an inner surface of the housing or a side wall of a structure provided inside the housing.

7. The electronic device of claim 6, wherein the structure comprises a battery frame.

8. The electronic device of claim 6, wherein the mounting part comprises:
    a first extension part that extends from a peripheral portion of the mounting part to be adjacent to a corner to which side walls of the structure are connected, by a length; and
    a second extension part that extends from the first extension part in parallel with the side wall, to which the length extension part is attached.

9. The electronic device of claim 8, wherein the first bending part connects the second extension part and the length extension part.

10. The electronic device of claim 8,
    wherein at least one of the first extension part or the second extension part comprises a screw coupling member having a screw coupling hole, and
    wherein a screw member is inserted into the screw coupling hole to fix at least one of the first extension part or the second extension part to the housing.

11. The electronic device of claim 6,
    wherein the length extension part comprises a screw coupling hole, and
    wherein a screw member is inserted into the screw coupling hole to fix the length extension part to the inner surface of the housing or the side wall of the structure.

12. The electronic device of claim 1, further comprising:
    a second connector which extends from a second part of the mounting part and configured to be connected to the second printed circuit board,
    wherein the second connector comprises:
        a third bending part that extends from the second part of the mounting part; and
        at least one connection part connected to the third bending part and provided to be connected to the second printed circuit board.

13. The electronic device of claim 12,
    wherein the third bending part comprises a flexible printed circuit board, and
    wherein a portion of the third bending part is bent towards the second printed circuit board.

14. The electronic device of claim 12,
    wherein the first connector comprises a first signal line for transmitting and receiving a first signal, and
    wherein the second connector comprises a second signal line for transmitting and receiving a second signal.

15. The electronic device of claim 14,
    wherein the first signal comprises at least one of a high-frequency signal, a high-speed interface signal, or a power signal, and
    wherein the second signal comprises a digital signal.

16. The electronic device of claim 14,
    wherein the first signal comprises a data signal inputted through an interface, and
    wherein the second signal comprises a power signal inputted through the interface.

17. The electronic device of claim 1, further comprising:
a third connector which extends from a third part of the mounting part to be connected to a fourth part of the mounting part.

18. The electronic device of claim 17, wherein the third connector comprises:
a third bending part that extends from the third part of the mounting part;
a length extension part that extends from the third bending part towards the fourth part of the mounting part by a length; and
a fourth bending part that extends from the fourth part of the mounting part to be connected to the length extension part, by a length.

19. The electronic device of claim 18, wherein the length extension part is disposed to be attached to an inner surface of the housing or a side wall of a structure provided inside the housing.

20. The electronic device of claim 17, wherein the first connector and the third connector are integrally provided.

* * * * *